(12) United States Patent
Yeon et al.

(10) Patent No.: US 12,293,980 B2
(45) Date of Patent: May 6, 2025

(54) PACKAGE COMPRISING DISCRETE ANTENNA DEVICE

(71) Applicant: QUALCOMM Incorporated, San Diego, CA (US)

(72) Inventors: Jaehyun Yeon, San Diego, CA (US); Suhyung Hwang, Rancho Mission Viejo, CA (US); Chin-Kwan Kim, San Diego, CA (US); Rajneesh Kumar, San Diego, CA (US); Darryl Sheldon Jessie, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 317 days.

(21) Appl. No.: 16/870,642

(22) Filed: May 8, 2020

(65) Prior Publication Data

US 2021/0091017 A1    Mar. 25, 2021

Related U.S. Application Data

(60) Provisional application No. 62/903,378, filed on Sep. 20, 2019.

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC .............. H01L 21/065; H01L 23/3121; H01L 23/5383; H01L 23/552; H01L 23/66;
(Continued)

(56) References Cited

U.S. PATENT DOCUMENTS

2009/0256752 A1    10/2009    Akkermans et al.
2017/0125881 A1*    5/2017    Mangrum .............. H01L 23/66
(Continued)

FOREIGN PATENT DOCUMENTS

CN    109712946 A    5/2019

OTHER PUBLICATIONS

Exynos Platforms for 5G Commercialization, The Market-Proven 5G Solutions, 1 page.
(Continued)

*Primary Examiner* — Marcos D. Pizarro
(74) *Attorney, Agent, or Firm* — Loza & Loza, LLP

(57) ABSTRACT

A package comprising a substrate, a first antenna device, and an integrated device. The substrate comprising a first surface and a second surface, where the substrate comprises a plurality of interconnects. The first antenna device is coupled to the first surface of the substrate, through a first plurality of solder interconnects. The integrated device is coupled to the second surface of the substrate. The package may include an encapsulation layer located over the second surface of the substrate, where the encapsulation layer encapsulates the integrated device. The package may include a shield formed over a surface of the encapsulation layer, where the shield includes an electromagnetic interference (EMI) shield.

17 Claims, 21 Drawing Sheets

PROFILE VIEW

(51) Int. Cl.

| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |
| *H01L 23/552* | (2006.01) |
| *H01Q 1/22* | (2006.01) |
| *H01Q 1/52* | (2006.01) |
| *H01Q 5/307* | (2015.01) |
| *H01Q 9/16* | (2006.01) |
| *H01Q 21/06* | (2006.01) |

(52) U.S. Cl.
CPC ........ *H01L 21/565* (2013.01); *H01L 23/3121* (2013.01); *H01L 23/49822* (2013.01); *H01L 23/49838* (2013.01); *H01L 23/5383* (2013.01); *H01L 23/552* (2013.01); *H01L 24/16* (2013.01); *H01Q 1/2283* (2013.01); *H01Q 1/526* (2013.01); *H01Q 5/307* (2015.01); *H01Q 9/16* (2013.01); *H01Q 21/065* (2013.01); *H01L 2223/6677* (2013.01); *H01L 2224/16227* (2013.01); *H01L 2924/1904* (2013.01); *H01L 2924/19041* (2013.01); *H01L 2924/19042* (2013.01); *H01L 2924/19101* (2013.01); *H01L 2924/19105* (2013.01); *H01L 2924/3025* (2013.01)

(58) Field of Classification Search
CPC ......... H01L 21/4857; H01L 2223/6677; H01L 2924/1904; H01L 2924/19101; H01L 2924/3025; H01Q 1/2283; H01Q 1/526; H01Q 5/307
See application file for complete search history.

(56) References Cited

U.S. PATENT DOCUMENTS

| | | | |
|---|---|---|---|
| 2018/0286780 A1 | 10/2018 | Qi et al. | |
| 2019/0035749 A1* | 1/2019 | Dalmia | ................ H01Q 1/2283 |
| 2019/0139915 A1* | 5/2019 | Kushnir | ................ H01L 23/552 |
| 2019/0191597 A1 | 6/2019 | Han et al. | |
| 2019/0372198 A1* | 12/2019 | Dalmia | ................ H01Q 21/065 |
| 2020/0112081 A1* | 4/2020 | Kim | ..................... H01Q 21/065 |
| 2020/0176376 A1 | 6/2020 | Ndip et al. | |
| 2020/0395675 A1 | 12/2020 | Han et al. | |

OTHER PUBLICATIONS

Ultra Small 5G mmWave Antenna Module, PCB Antenna, Design Flexibility, 1 page.

* cited by examiner

PROFILE VIEW

PROFILE VIEW

PROFILE VIEW

ANTENNA DEVICE
BOTTOM PLAN VIEW

ANTENNA DEVICE
TOP PLAN VIEW

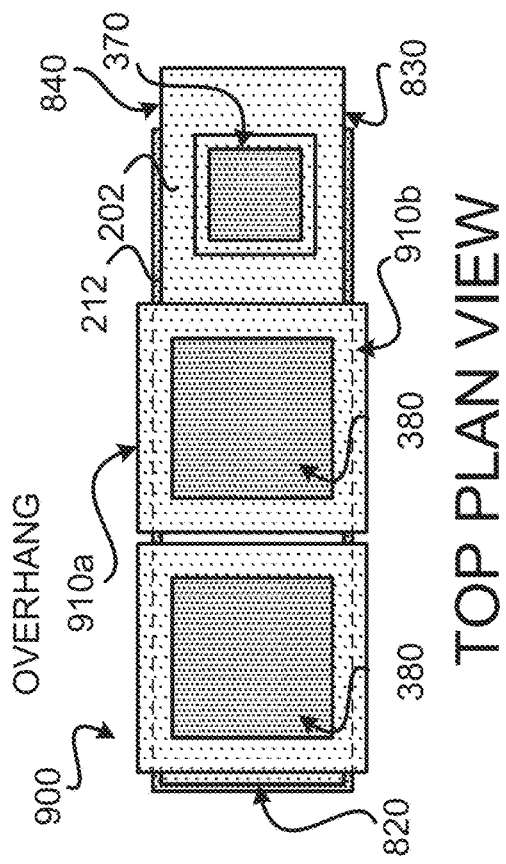
FIG. 8 TOP PLAN VIEW
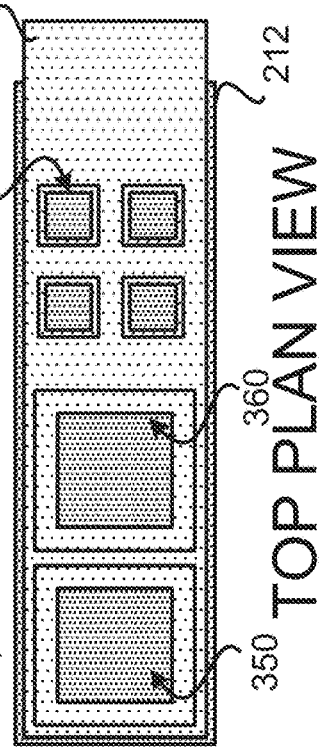
FIG. 9 TOP PLAN VIEW
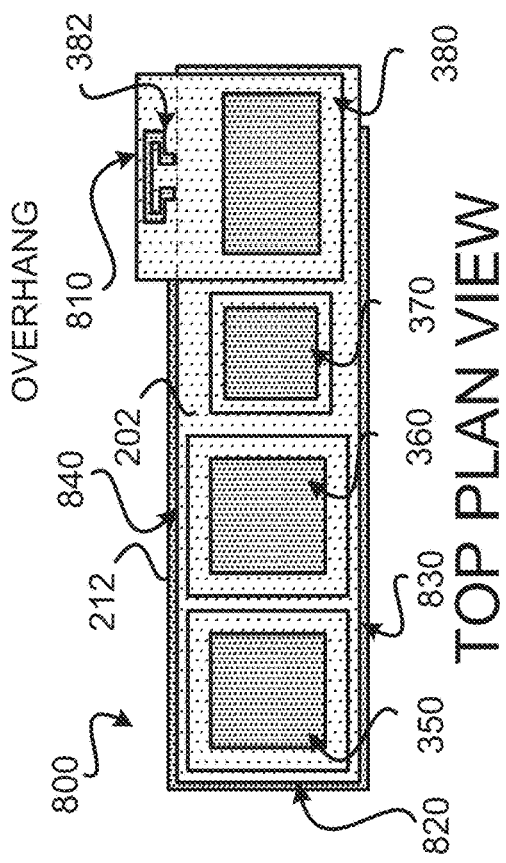
FIG. 10 TOP PLAN VIEW
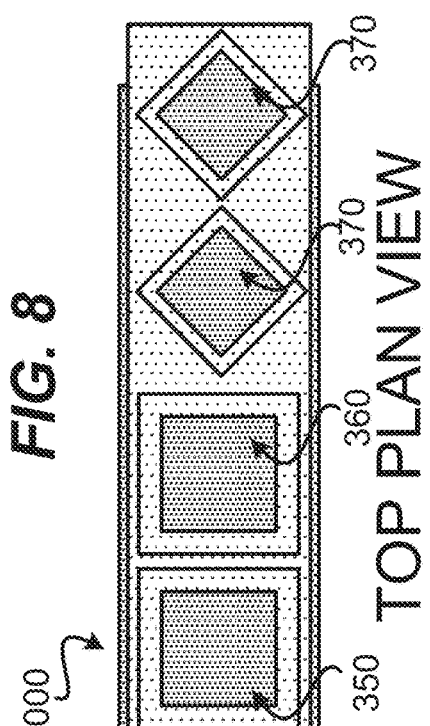
FIG. 11 TOP PLAN VIEW DIELECTRIC LAYER(S) FORMATION
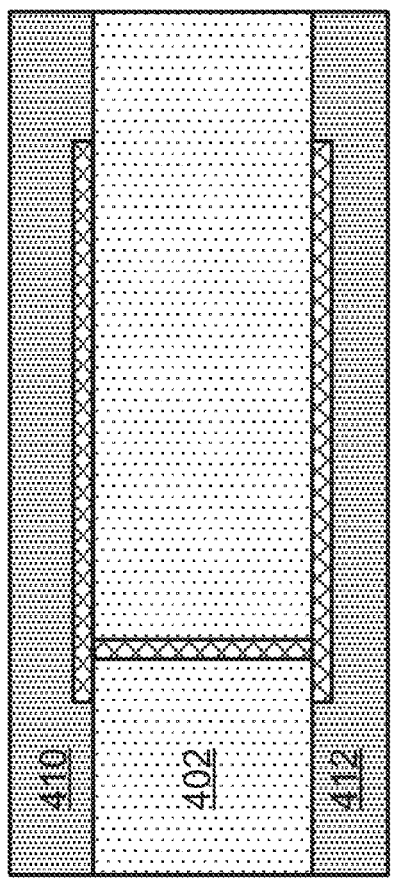
CAVITY FORMATION
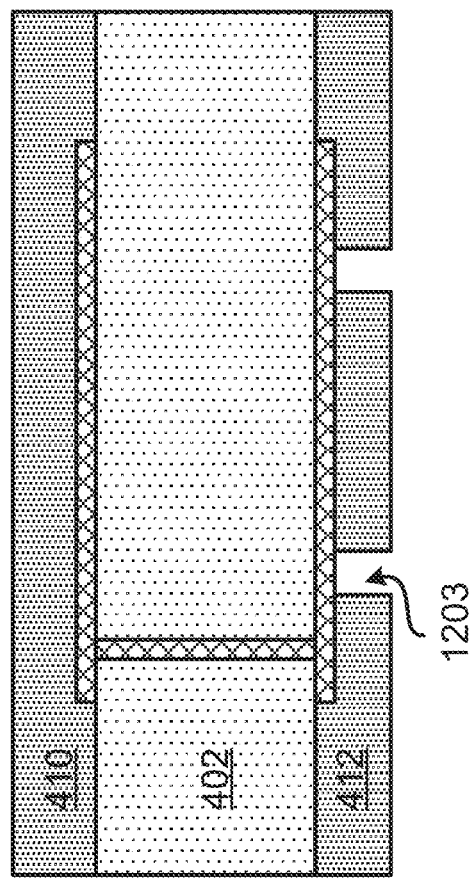
FIG. 12B

PACKAGE COMPRISING DISCRETE ANTENNA DEVICE

CROSS-REFERENCE/CLAIM OF PRIORITY TO RELATED APPLICATION

The present application claims priority to and the benefit of U.S. Provisional Application No. 62/903,378, filed on Sep. 20, 2019, and titled, "PACKAGE COMPRISING DISCRETE ANTENNA DEVICE", which is hereby expressly incorporated by reference.

FIELD

Various features relate to packages with an antenna, but more specifically to a package that includes a discrete antenna device.

BACKGROUND

FIG. 1 illustrates a package 100 that includes a substrate 102 and a die 103. The die 103 is coupled to the substrate 102. The substrate 102 includes a dielectric layer 120 and a plurality of interconnects 122. The substrate 102 also includes a first antenna 150 and a second antenna 160. Both the first antenna 150 and the second antenna 160 are embedded in the substrate 102. The first antenna 150 is defined by a first plurality of interconnects 152, and the second antenna 160 is defined by a second plurality of interconnects 162.

There is an ongoing need to provide packages with antennas, where the packages have better transmitting and receiving performances.

SUMMARY

Various features relate to packages with an antenna, but more specifically to a package that includes a discrete antenna device.

One example provides a package that includes a substrate, a first antenna device, and an integrated device. The substrate includes a first surface and a second surface, wherein the substrate comprises a plurality of interconnects. The first antenna device is coupled to the first surface of the substrate, through a first plurality of solder interconnects. The integrated device is coupled to the second surface of the substrate. The package includes a shield formed over the second surface of the substrate, wherein the shield comprises an electromagnetic interference (EMI) shield.

Another example provides an apparatus that includes a substrate, first means for transmitting and receiving a first signal, and an integrated device. The substrate includes a first surface and a second surface, where the substrate comprises a plurality of interconnects. The first means for transmitting and receiving a first signal, is coupled to the first surface of the substrate, through a first plurality of solder interconnects. The integrated device is coupled to the second surface of the substrate. The apparatus includes means for shielding formed over the second surface of the substrate, wherein the means for shielding is configured to provide electromagnetic interference (EMI) shielding.

Another example provides a method for fabricating a package. The method couples an integrated device to a second surface of the substrate, where the substrate comprises a plurality of interconnects. The method encapsulates the integrated device with an encapsulation layer such that the encapsulation layer is located over the second surface of the substrate. The method forms a shield over a surface of the encapsulation layer. The method couples a first antenna device to a first surface of the substrate, through a first plurality of solder interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIG. 8 illustrates a top plan view of an exemplary package that includes several discrete antenna devices.

FIG. 9 illustrates a top plan view of another exemplary package that includes several discrete antenna devices.

FIG. 10 illustrates a top plan view of another exemplary package that includes several discrete antenna devices.

FIG. 11 illustrates a top plan view of another exemplary package that includes several discrete antenna devices.

FIGS. 12A-12D illustrate an exemplary sequence for fabricating a discrete antenna device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first antenna device, and an integrated device. The substrate includes a first surface and a second surface, where the substrate includes a plurality of interconnects. The first antenna device is coupled to the first surface of the substrate, through a first plurality of solder interconnects. The first antenna device is a discrete device from the substrate. The integrated device is coupled to the second surface of the substrate. The package may include an encapsulation layer located over the second surface of the substrate, where the encapsulation layer encapsulates the integrated device. The package may include a shield formed over a surface of the encapsulation layer, where the shield includes an electromagnetic interference (EMI) shield. In some implementations, the package may include other discrete antenna devices (e.g., second antenna device, third antenna device) that are coupled to the substrate. The discrete antenna devices allow different types of antennas to be easily placed in the package, thus allowing the package to be easily designed and configured to meet the requirements of various network operators (e.g., cellular network operators). The package may be an antenna in package (AiP). The package may a radio frequency (RF) package.

Exemplary Device Comprising Package Comprising Discrete Antenna Devices

Figure 1:
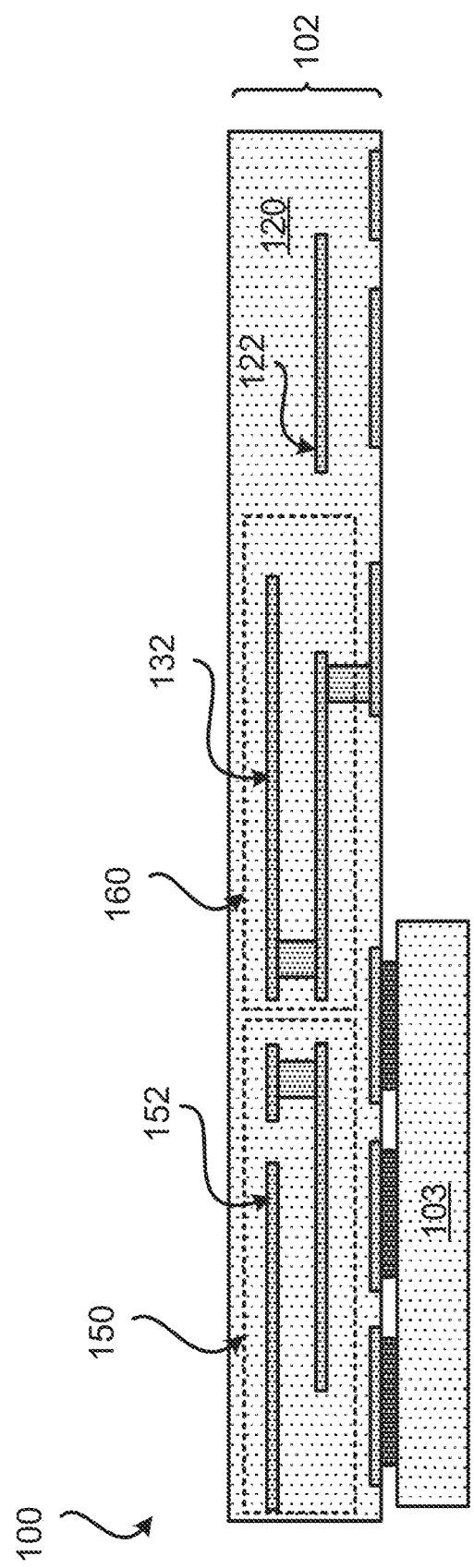
FIG. 1 illustrates a profile view of a package that includes a substrate with antennas embedded in the substrate.
Figure 2:
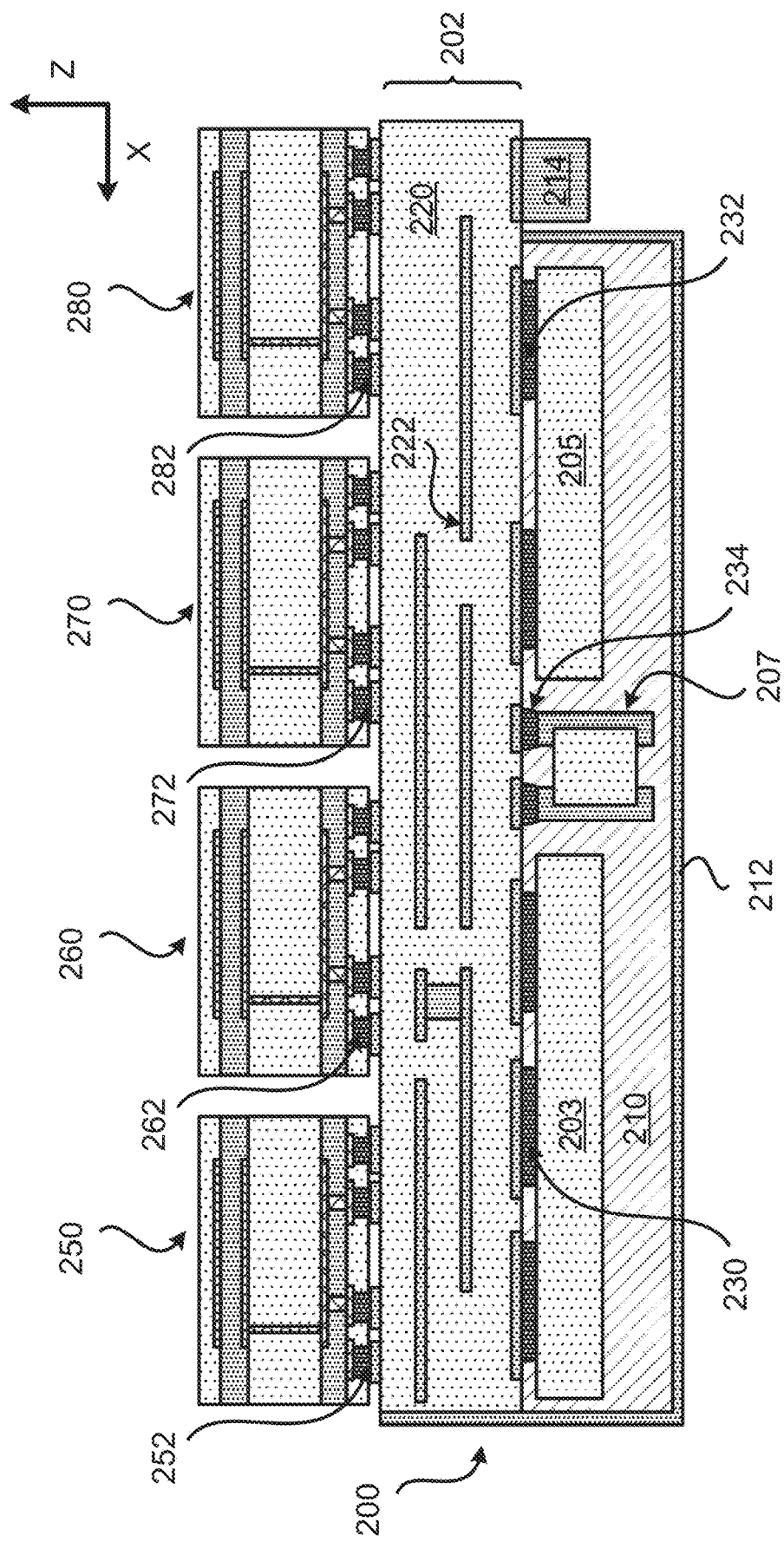
FIG. 2 illustrates a profile view of an exemplary package that includes several discrete antenna devices.

FIG. 2 illustrates a profile view of a package 200 that includes a plurality of discrete antenna devices. The package 200 may be antenna in package (AiP). The package 200 may be a radio frequency (RF) package. The package 200 may be configured to provide Wireless Fidelity (WiFi) communication and/or cellular communication (e.g., 2G, 3G, 4G, 5G). The package 200 may be configured to support Global System for Mobile Communications (GSM), Universal Mobile Telecommunications System (UMTS), and/or Long-Term Evolution (LTE). The package 200 may be configured to transmit and receive signals having different frequencies and/or communication protocols.

The package 200 includes a substrate 202, a first integrated device 203, a second integrated device 205, a passive device 207, a first antenna device 250, a second antenna device 260, a third antenna device 270, and a fourth antenna device 280. The substrate 202 includes at least one dielectric layer 220 and a plurality of interconnects 222. The substrate 202 includes a first surface (e.g., top surface) and a second surface (e.g., bottom surface). The first integrated device 203 is coupled to the second surface of the substrate 202, through a plurality of solder interconnects 230. The second integrated device 205 is coupled to the second surface of the substrate 202, through a plurality of solder interconnects 232. The first integrated device 203 and the second integrated device 205 may include a die (e.g., processor die, memory die). The passive device 207 is coupled to the second surface of the substrate 202, through a plurality of solder interconnects 234. A passive device may include a capacitor or an inductor. For example, the passive device 207 is a capacitor. A connector 214 is coupled to the second surface of the substrate 202.

The package 200 may include an encapsulation layer 210 and a shield 212. The encapsulation layer 210 may be formed over the second surface of the substrate 202. The encapsulation layer 210 may encapsulate the first integrated device 203, the second integrated device 205 and the passive device 207. The encapsulation layer 210 may include a mold, a resin and/or an epoxy. The encapsulation layer 210 may be a means for encapsulation. In some implementations, the encapsulation layer 210 is located over the second surface of the substrate 202 such that (i) a first vertical surface of the encapsulation layer 210 is coplanar with a first vertical surface of the substrate 202, (ii) a second vertical surface of the encapsulation layer 210 is coplanar with a second vertical surface of the substrate 202, and/or (iii) a third vertical surface of the encapsulation layer 210 is coplanar with a third vertical surface of the substrate 202. Examples of how one or more vertical surfaces of the encapsulation layer 210 may be coplanar with one or more vertical surfaces of the substrate 202 are illustrated and described in at least FIGS. 2,3 and 8-11.

The shield 212 may be a means for shielding. The shield 212 is formed over the second surface of the substrate 202. In particular, the shield 212 is formed over a surface (e.g., an outer surface) of the encapsulation layer 210. The shield 212 may also be formed over a side surface of the substrate 202. For example, the shield 212 may be formed over a side surface of the at least one dielectric layer 220 of the substrate 202. The shield 212 may include one or more metal layers (e.g., patterned metal layer) over one or more surfaces of the encapsulation layer 210 and/or the side surface of the substrate 202. The shield 212 may be configured to operate as an electromagnetic interference (EMI) shield. The shield 212 may be a means for EMI shielding. The shield 212 may be configured to operate as a Faraday cage.

The package 200 may include a connector 214. The connector 214 may be configured to allow the package 200 to be electrically coupled to one or more other devices. Different implementations may use different types of connections to electrically couple the package 200 to other devices. For example, the package 200 may be coupled to the other devices through wires and/or flexible interconnects. Power for the package 200 may be provided through the connector 214.

FIG. 2 illustrates that the first antenna device 250, the second antenna device 260, the third antenna device 270 and the fourth antenna device 280 are coupled to the first surface of the substrate 202. The first antenna device 250 is coupled to the first surface of the substrate 202 through a first plurality of solder interconnects 252. The second antenna device 260 is coupled to the first surface of the substrate 202 through a second plurality of solder interconnects 262. The third antenna device 270 is coupled to the first surface of the substrate 202 through a third plurality of solder interconnects 272. The fourth antenna device 280 is coupled to the first surface of the substrate 202 through a fourth plurality of solder interconnects 282. The first antenna device 250, the second antenna device 260, the third antenna device 270, and the fourth antenna device 280 may each be discrete antenna devices.

The first antenna device 250, the second antenna device 260, the third antenna device 270, the fourth antenna device 280, and/or combinations thereof, may be configured to provide Wireless Fidelity (WiFi) communication and/or cellular communication (e.g., 2G, 3G, 4G, 5G). The first antenna device 250, the second antenna device 260, the third antenna device 270, the fourth antenna device 280, and/or combinations thereof, may be configured to support Global System for Mobile Communications (GSM), Universal Mobile Telecommunications System (UMTS), and/or Long-Term Evolution (LTE). In some implementations, one or more of the antenna devices (e.g., 250, 260, 270, 280), may be configured as a proximity sensor. When a particular antenna device is configured to operate as a proximity sensor, the particular antenna device may be capable of detecting the placement and/or movement of one or more objects (e.g., hand, finger(s)) near the particular antenna device.

The first antenna device 250, the second antenna device 260, the third antenna device 270, the fourth antenna device 280, and/or combinations thereof, may be configured to transmit and receive signals having different frequencies and/or communication protocols. The first antenna device 250 may be a first means for transmitting and receiving a first signal. The second antenna device 260 may be a second means for transmitting and receiving a second signal. The third antenna device 270 may be a third means for transmitting and receiving a third signal. The fourth antenna device 280 may be a fourth means for transmitting and receiving a fourth signal. The first signal, the second signal, the third signal, and/or the fourth signal may have the same or different properties. For example, the signals may have the same or different frequencies and/or communication protocols. A signal may be an analog signal or a digital signal.

As mentioned above, one advantage of using discrete antenna devices is the ability to design and configure the package to meet specific operational requirements of cellular network operators, without having to redesign the entire substrate. Thus, various discrete antenna devices may be mixed and matched together to work with different cellular network operations. Moreover, the discrete antenna devices operate more efficiently than a substrate embedded antenna would because the discrete antenna devices are not laterally surrounded by the shield 212. The antenna devices (e.g., 250, 260, 270, 280) may be discrete from the substrate 202 because the antenna devices are fabricated during a process that is separate than the fabrication of the substrate 202. Another advantage of the discrete antenna devices is that they are not limited by the size, dimensions, and fabrication limitations of the substrate 202. For example, as will be further described below, an antenna device may partially overhang over the substrate 202.

Different implementations may use the same or different types of antenna devices. The antenna devices may have the same sizes, shapes, and/or configurations, or they may have different sizes, shapes, and/or configurations.

Figure 3:
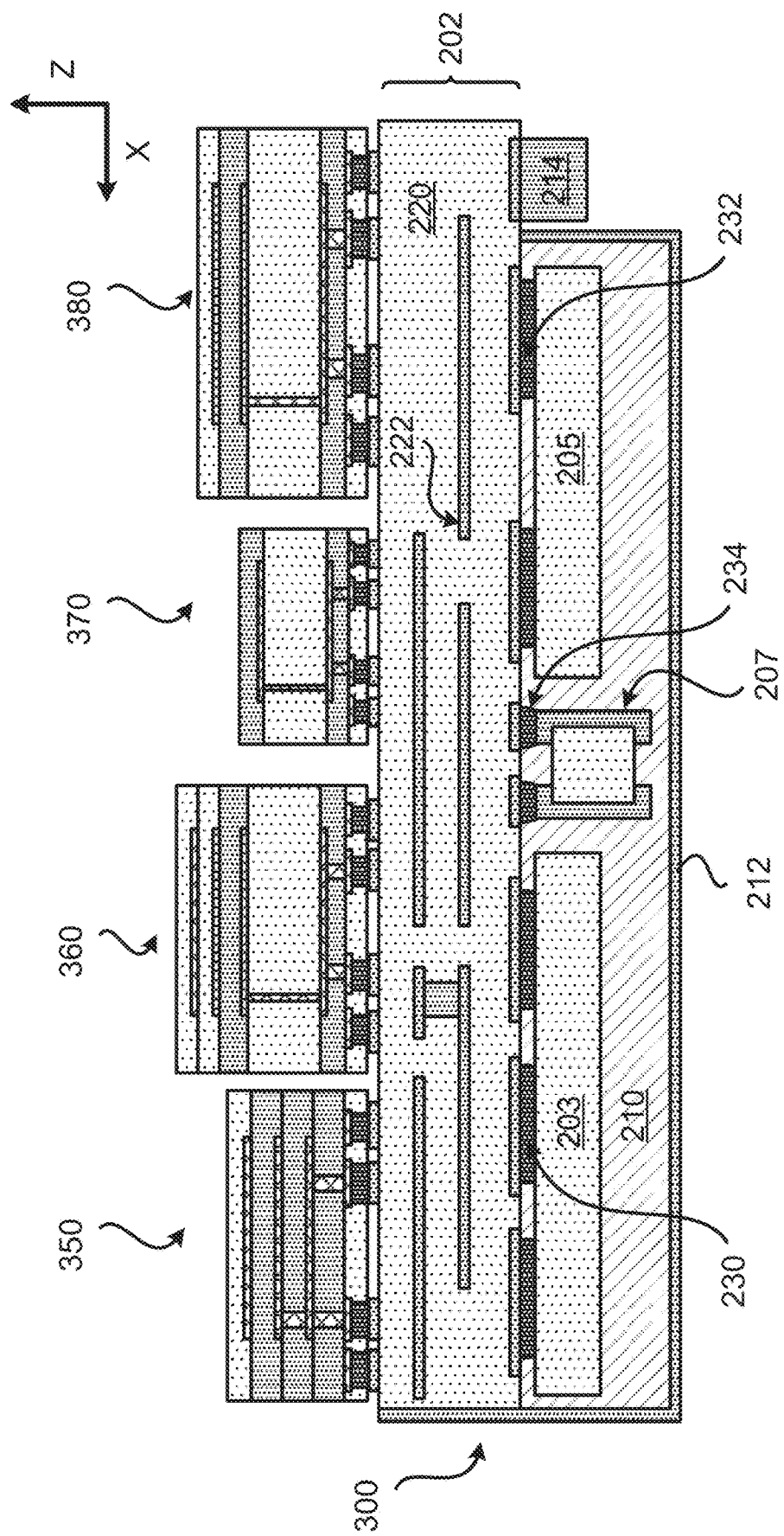
FIG. 3 illustrates a profile view of another exemplary package that includes several discrete antenna devices.

FIG. 3 illustrates a package 300 that includes discrete antenna devices with different sizes, shapes, types and/or configurations. The package 300 is similar to the package 200 of FIG. 2. The package 300 may include the same component(s) and/or similar component(s) as the package 200. The package 300 includes a first antenna device 350, a second antenna device 360, a third antenna device 370 and a fourth antenna device 380. the first antenna device 350, the second antenna device 360, the third antenna device 370 and the fourth antenna device 380 may be similar to the first antenna device 250, the second antenna device 260, the third antenna device 270 and the fourth antenna device 280 of FIG. 2, but may have different sizes, shapes, orientations, height, width, length, configurations, functionalities, capabilities and/or types.

FIG. 3 illustrates that the first antenna device 350, the second antenna device 360, the third antenna device 370 and the fourth antenna device 380 are coupled to the first surface of the substrate 202. The first antenna device 350, the second antenna device 360, the third antenna device 370, and the fourth antenna device 380 may each be discrete antenna devices.

The first antenna device 350, the second antenna device 360, the third antenna device 370, the fourth antenna device 380, and/or combinations thereof, may be configured to provide Wireless Fidelity (WiFi) communication and/or cellular communication (e.g., 2G, 3G, 4G, 5G). The first antenna device 350, the second antenna device 360, the third antenna device 370, the fourth antenna device 380, and/or combinations thereof, may be configured to support Global System for Mobile Communications (GSM), Universal Mobile Telecommunications System (UMTS), and/or Long-Term Evolution (LTE). In some implementations, one or more of the antenna devices (e.g., 350, 360, 370, 380), may be configured as a proximity sensor. When a particular antenna device is configured to operate as a proximity sensor, the particular antenna device may be capable of detecting the placement and/or movement of one or more objects (e.g., hand, finger(s)) near the particular antenna device.

The first antenna device 350, the second antenna device 360, the third antenna device 370, the fourth antenna device 380, and/or combinations thereof, may be configured to transmit and receive signals having different frequencies and/or communication protocols. The first antenna device 350 may be a first means for transmitting and receiving a first signal. The second antenna device 360 may be a second means for transmitting and receiving a second signal. The third antenna device 370 may be a third means for transmitting and receiving a third signal. The fourth antenna device 380 may be a fourth means for transmitting and receiving a fourth signal. The first signal, the second signal, the third signal, and/or the fourth signal may have the same or different properties. For example, the signals may have the same or different frequencies and/or communication protocols. As an example, a first antenna device may be configured to transmit and receive a first signal having a first frequency (or first range of frequencies), and a second antenna device may be configured to transmit and receive a second signal having a second frequency (or second range of frequencies). A signal may be an analog signal or a digital signal.

It is noted that FIGS. 2 and 3 are merely examples of configurations that include discrete antenna devices. Different implementations may have different numbers of antenna devices, passive devices and/or integrated devices. For example, some implementations of a package may include more than four (4) antenna devices, while other implementations of a package may include less than four (4) antenna devices. Similarly, some implementations of a package may include more than one passive device. In some implementations, a package may include one integrated device, or may include two or more integrated devices. Having described packages that include discrete antenna devices, examples of antenna devices are described below.

Exemplary Discrete Antenna Devices

Figure 4:
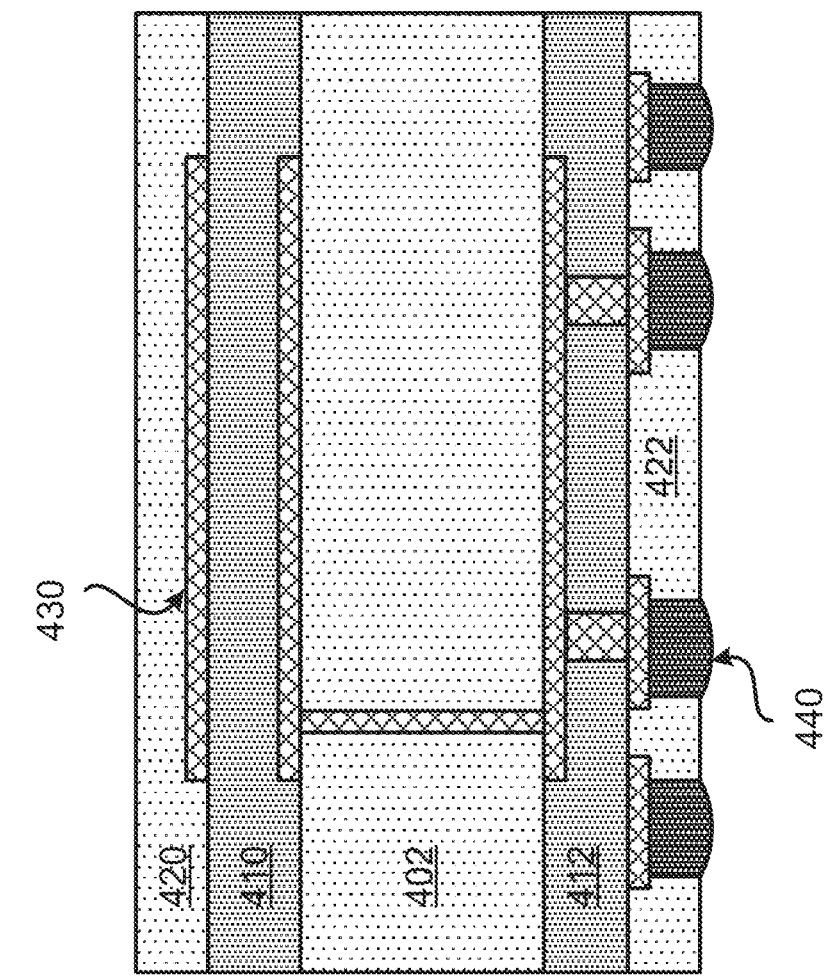
FIG. 4 illustrates a profile view of an exemplary discrete antenna device.

FIG. 4 illustrates an antenna device 400. The antenna device 400 may represent any of the antenna devices (e.g., 250, 260, 270, 280, 360, 370, 380) described in the disclosure. The antenna device 400 may be a means for transmitting and receiving a signal. The antenna device 400 may be coupled to a substrate of a package. The antenna device 400 may be a discrete antenna device that is fabricated during a fabrication process that is separate than a process used to fabricate a substrate.

The antenna device 400 includes a first dielectric layer 402, a second dielectric layer 410, a third dielectric layer 412, a first solder resist layer 420, a second solder resist layer 422, and a plurality of interconnects 430. The first dielectric layer 402 may be a core layer. The second dielectric layer 410 is formed over a first surface of the first dielectric layer 402. The third dielectric layer 412 is formed over a second surface of the first dielectric layer 402. The plurality of interconnects 430 may be located and formed in and over the first dielectric layer 402, the second dielectric layer 410, and the third dielectric layer 412. The plurality of interconnects 430 may include vias, pads and/or traces. At least one interconnect from the plurality of interconnects 430 may be configured to operate as an antenna capable of transmitting and/or receiving signals. The antenna device 400 may include one or more antennas. One or more antennas may be located on a top metal layer of the antenna device 400. A top metal layer of the antenna device 400 may be a metal layer that is furthest away from the plurality of solder interconnects 440. It is noted that an antenna may be located on any metal layer of the antenna device 400. An antenna may be located on multiple metal layers of the antenna device 400. It is noted that different implementations may have different numbers of dielectric layers and/or different number of metal layers. The first solder resist layer 420 is formed over the second dielectric layer 410, and the second solder resist layer 422 is formed over the third dielectric layer 412. The antenna device 400 may include a plurality of solder interconnects 440. The plurality of solder interconnects 440 is coupled to the plurality of interconnects 430. The dielectric layers (e.g., 402, 410, 412) of the antenna device 400 may be made of the same, similar or different materials than the dielectric layer 220 of the substrate 202. Examples of dielectric layers include organic dielectric materials and/or ceramics. In some implementations, some of the dielectric layers may be considered part of the same dielectric layer.

Figure 5:
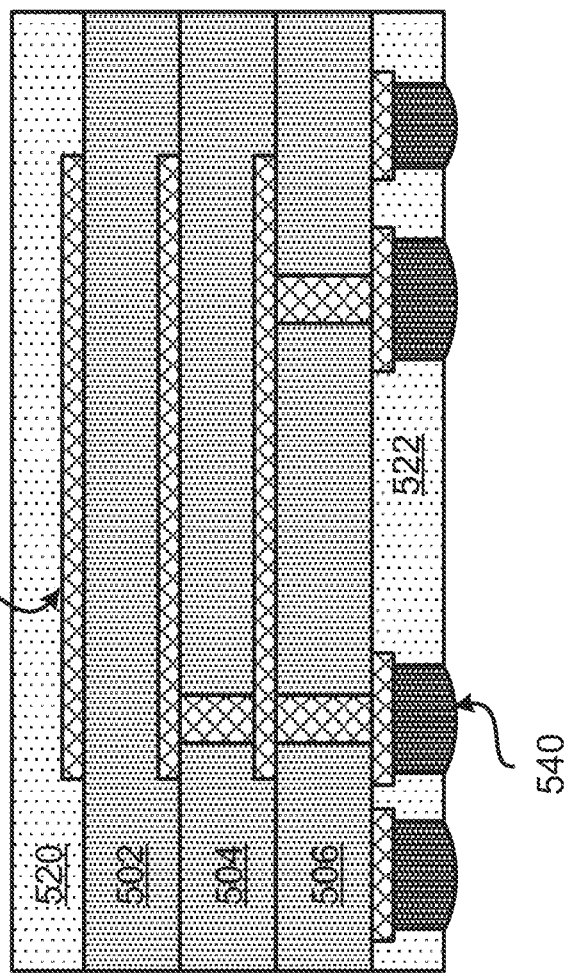
FIG. 5 illustrates a profile view of another exemplary discrete antenna device.

FIG. 5 illustrates an antenna device 500. The antenna device is another example of an antenna device that may be implemented with a substrate. The antenna device 500 may represent any of the antenna devices (e.g., 350) described in the disclosure. The antenna device 500 may be a means for transmitting and receiving a signal. The antenna device 500 may be coupled to a substrate of a package. The antenna device 500 may be a discrete antenna device that is fabricated during a fabrication process that is separate than a process used to fabricate a substrate.

The antenna device 500 includes a first dielectric layer 502, a second dielectric layer 504, a third dielectric layer 506, a first solder resist layer 520, a second solder resist layer 522, and a plurality of interconnects 530. The second dielectric layer 505 is formed over the third dielectric layer 506. The first dielectric layer 502 is formed over the second dielectric layer 504. The plurality of interconnects 530 may be located and formed in and over the first dielectric layer 502, the second dielectric layer 504, and the third dielectric layer 506. The plurality of interconnects 530 may include vias, pads and/or traces. At least one interconnect from the plurality of interconnects 530 may be configured to operate as an antenna capable of transmitting and/or receiving signals. The antenna device 500 may include one or more antennas. One or more antennas may be located on a top metal layer of the antenna device 500. A top metal layer of the antenna device 500 may be a metal layer that is furthest away from the plurality of solder interconnects 540. It is noted that an antenna may be located on any metal layer of the antenna device 500. An antenna may be located on multiple metal layers of the antenna device 500. It is noted that different implementations may have different numbers of dielectric layers and/or different number of metal layers. The first solder resist layer 520 is formed over the first dielectric layer 502, and the second solder resist layer 522 is formed over the third dielectric layer 506. The antenna device 500 may include a plurality of solder interconnects 540. The plurality of solder interconnects 540 is coupled to the plurality of interconnects 530. The dielectric layers (e.g., 502, 504, 506) of the antenna device 500 may be made of the same, similar or different materials than the dielectric layer 220 of the substrate 202. Examples of dielectric layers include organic dielectric materials and/or ceramics.

The first dielectric layer 502, the second dielectric layer 504, and/or the third dielectric layer 506 may include ceramic, such a low temperature co-fired ceramic (LTCC) and/or high temperature co-fired ceramic (HTCC). The first dielectric layer 502, the second dielectric layer 504, and/or the third dielectric layer 506 may be considered part of the same dielectric layer.

The antenna device 400 and/or the antenna device 500 may be configured to provide Wireless Fidelity (WiFi) communication and/or cellular communication (e.g., 2G, 3G, 4G, 5G). The first antenna device 350, the second antenna device 360, the third antenna device 370, the fourth antenna device 380, and/or combinations thereof, may be configured to support Global System for Mobile Communications (GSM), Universal Mobile Telecommunications System (UMTS), and/or Long-Term Evolution (LTE).

Figure 7:
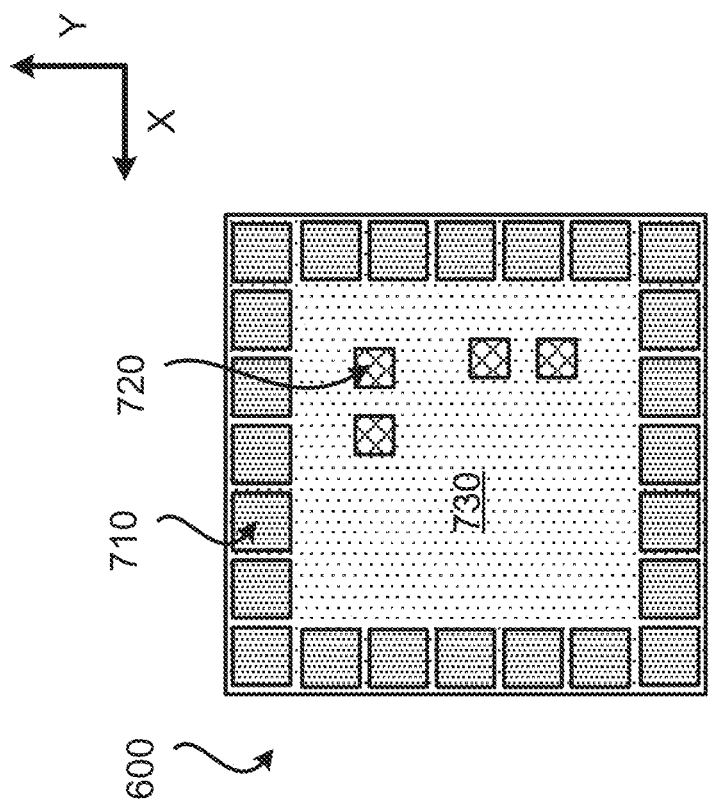
FIG. 7 illustrates an exemplary bottom plan view of a discrete antenna device.
Figure 6:
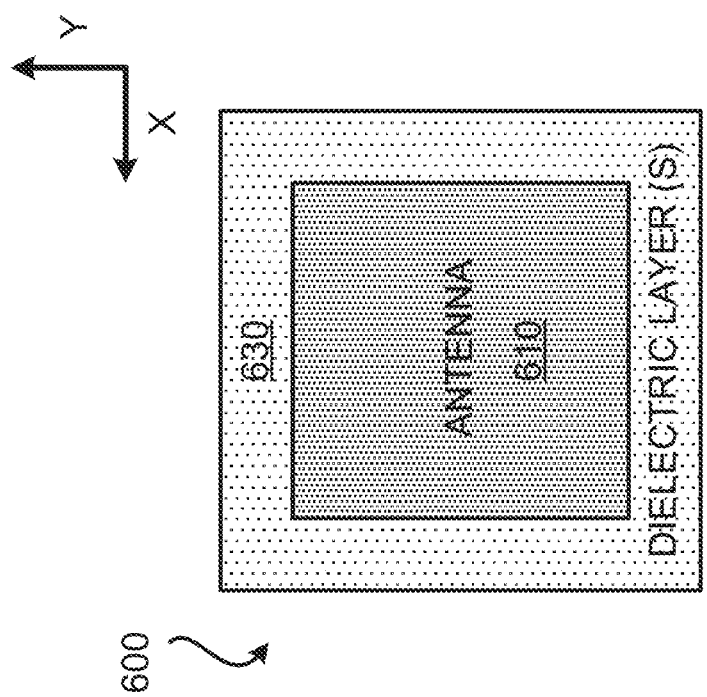
FIG. 6 illustrates an exemplary top plan view of a discrete antenna device.

FIGS. 6 and 7 respectively illustrate examples of top and bottom view of an antenna device. The antenna device 600 may represent any of the antenna devices (e.g., 400, 500) described in the disclosure. The antenna device 600 includes an antenna 610 and at least one dielectric layer 630. The antenna 610 may be defined by at least one interconnect from a plurality of interconnects of the antenna device 600. The antenna 610 may be located in any metal layer of the antenna device 600, include a top metal layer of the antenna device 600. The antenna 610 has a square shape. However, the antenna 610 may have any shape. Thus, the shape of the antenna 610 shown in FIG. 6 and the other figures of the disclosure, may represent the actual shape of the antenna or a conceptual representation of an antenna. Moreover, the antenna device 600 may include more than one antenna. The antenna 610 may be coupled to a plurality of interconnects (e.g., 430, 530). The at least one dielectric layer 630 may represent any of the dielectric layers of the antenna device 600.

As shown in FIG. 7, the antenna device 600 includes a first plurality of pads 710, a second plurality of pads 720 and the at least one dielectric layer 730. The at least one dielectric layer 730 may represent any of the dielectric layers of the antenna device 600. The at least one dielectric layer 730 may include the at least one dielectric layer 630, and vice versa. The first plurality of pads 710 and the second plurality of pads 720 may be part of the plurality of interconnects 430 of FIG. 4 or the plurality of interconnects 530 of FIG. 5. The first plurality of pads 710 may be configured to provide electrical paths for ground. The second plurality of pads 720 may be configured to provide electrical paths for antenna signals.

Exemplary Arrangements of Discrete Antenna Devices

Antenna devices may be arranged over the substrate differently. FIGS. 8-11 illustrate examples of possible arrangements of antenna devices over a substrate. FIG. 8 illustrates a package 800 that includes a substrate 202, the shield 212, the first antenna device 350, the second antenna device 360, the third antenna device 370 and the fourth antenna device 380. FIG. 8 illustrates an overhang 810 over the substrate 202. In particular, FIG. 8 illustrates that part of the fourth antenna device 380 overhangs over the substrate 202 (e.g., vertically overhangs the third vertical surface 840 of the substrate 202). The fourth antenna device may also overhang the shield 212. The fourth antenna device 380 may include a dipole antenna 382. In some implementations, certain types of antenna may perform better when such an antenna overhang over a component. For example, the dipole antenna 382 may perform better if positioned in an overhang arrangement and/or in the overhang 810. The dipole antenna 382 may be part an antenna of the fourth antenna device 380 or may be a separate antenna from another antenna from the fourth antenna device 380. In some implementations, one or more of the antenna devices (e.g., 350, 360, 370, 380) of a package may be configured to operate as a dipole antenna or may include at least one dipole antenna. The dipole antenna (e.g., 382) may or may not be located over an overhang (e.g., 810, 910a, 910b). The dipole antenna (e.g., 382) may have different shapes and/or sizes. The dipole antenna 382 may be defined by at least one interconnect. It is noted that the use of a discrete antenna device allows a dipole antenna to overhang over the substrate.

FIG. 9 illustrates a package 900 that includes the substrate 202, two fourth antenna devices 380 and a third antenna device 270. Each of the fourth antenna devices 380 overhangs on both sides (e.g., second vertical surface 830, third vertical surface 840) of the substrate 202. Each of the fourth antenna devices 380 may also overhang the shield 212.

FIG. 10 illustrates a package 1000 that includes the substrate 202, a first antenna device 350, a second antenna device 360, and two third antenna devices 370. The first antenna device 350 and the second antenna device 360 are aligned in the same direction, while the two third antenna devices 370 are aligned in a different direction (e.g., aligned diagonally). In some implementations, aligning the antenna devices in different directions may help improve the performance of one or more of the antenna devices.

FIG. 11 illustrates a package 1100 that includes the substrate 202, a first antenna device 350, a second antenna device 360, and four antenna devices 1150. The four antenna devices 1150 are smaller than the first antenna device 350 and the second antenna device 360. The four antenna devices 1150 arranged in a row and column formation.

It is noted that FIGS. 8-11 are merely examples of possible arrangements of the antenna devices over a substrate. Other implementations may include antenna devices with different shapes, different sizes, different alignments, and/or different constructions. Similarly, other implementations may include different numbers of antenna devices.

The encapsulation layer 210 is not visible in FIGS. 8-11 because the encapsulation layer 210 is located over the bottom side of the substrate 202. As mentioned above, in some implementations, the encapsulation layer 210 is located over the second surface (e.g., bottom surface) of the substrate 202 such that (i) a first vertical surface of the encapsulation layer 210 is coplanar with a first vertical surface (e.g., 820) of the substrate 202, (ii) a second vertical surface of the encapsulation layer 210 is coplanar with a second vertical surface (e.g., 830) of the substrate 202, and/or (iii) a third vertical surface of the encapsulation layer 210 is coplanar with a third vertical surface (e.g., 840) of the substrate 202. The shield 212 may be formed over the outer surface (e.g., first vertical surface, second vertical surface, third vertical surface) of the encapsulation layer 210. A discrete antenna, as used in the disclosure, may be an antenna that is fabricated separately from the substrate, and then coupled to the substrate (e.g., through a pick and place and reflow process).

Exemplary Sequence for Fabricating a Discrete Antenna Device

FIGS. 12A-12D illustrate an exemplary sequence for providing or fabricating a discrete antenna device. In some implementations, the sequence of FIGS. 12A-12D may be used to provide or fabricate the antenna device 400 of FIG. 4, or any of the antenna devices described in the disclosure.

It should be noted that the sequence of FIGS. 12A-12D may combine one or more stages in order to simplify and/or clarify the sequence for providing or fabricating the antenna device. In some implementations, the order of the processes may be changed or modified. In some implementations, one or more of processes may be replaced or substituted without departing from the spirit of the disclosure.

Figure 12A:
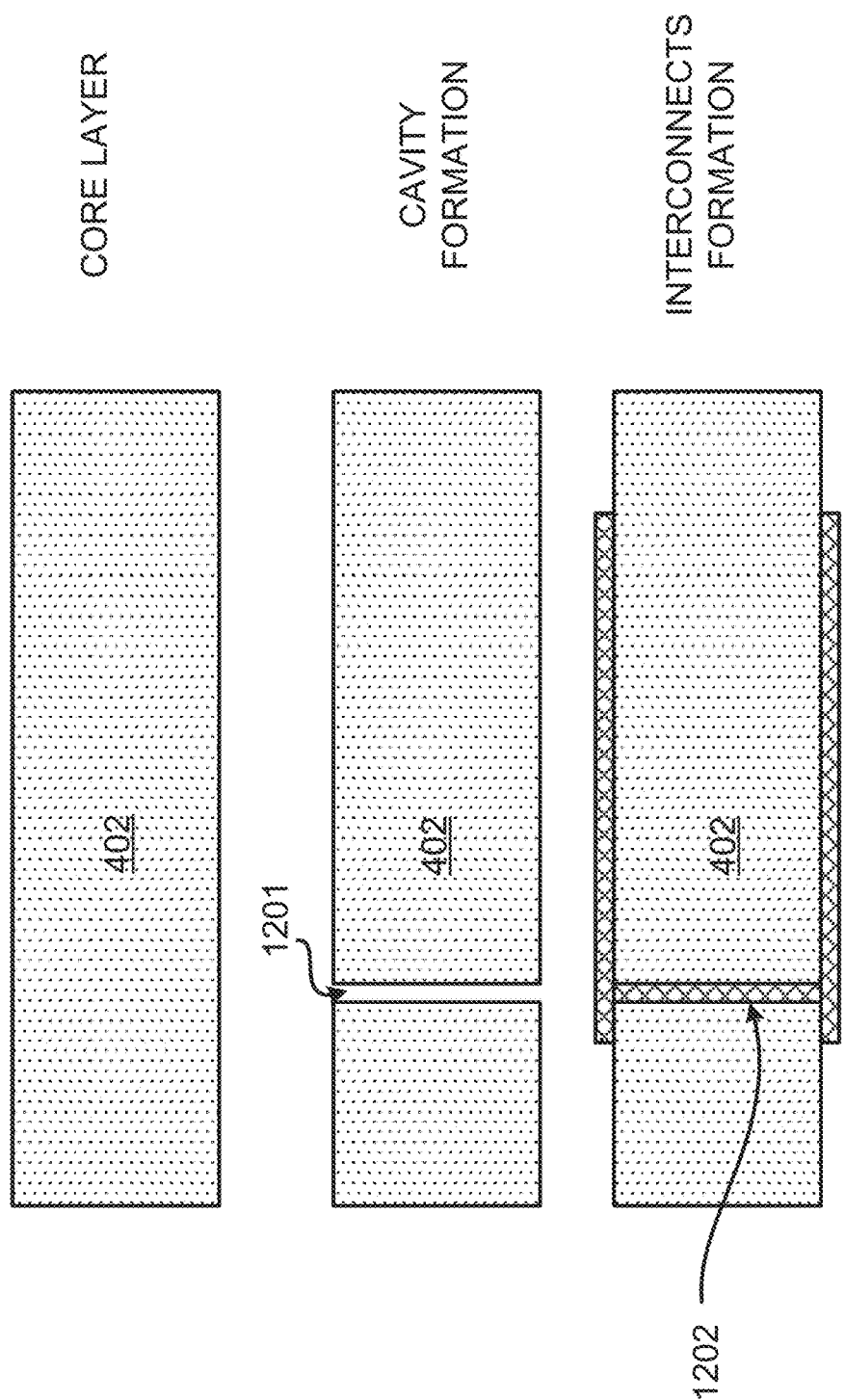

Stage 1, as shown in FIG. 12A, illustrates a state after a first dielectric layer 402 is provided. The first dielectric layer 402 may be a core layer. The first dielectric layer 402 may be silicon, glass, quartz, or combinations thereof.

Stage 2, illustrates a state after one or more cavities 1201 are formed in the first dielectric layer 402. A laser process or a photo etching process may be used to form the cavities 1201 in the first dielectric layer 402.

Stage 3 illustrates a state after a plurality of interconnects 1202 are formed in and over the first dielectric layer 402. A plating process may be used to form the plurality of interconnects 1202. The plurality of interconnects 1202 may include traces, vias and/or pads. The plurality of interconnects 1202 may include one or more metal layers (e.g., seed layer+metal layer).

Stage 4, as shown in FIG. 12B, illustrates a state after a second dielectric layer 410 is formed over a first surface of the first dielectric layer 402, and after a third dielectric layer 412 is formed over a second surface of the first dielectric layer 402. A lamination process may be used to form the second dielectric layer 410 and the third dielectric layer 412. The second dielectric layer 410 and/or the third dielectric layer 412 may be a photo-etchable dielectric layer.

Stage 5, illustrates a state after one or more cavities 1203 are formed in the third dielectric layer 412. A laser process or a photo etching process may be used to form the cavities 1203 in the third dielectric layer 412.

Figure 12C:
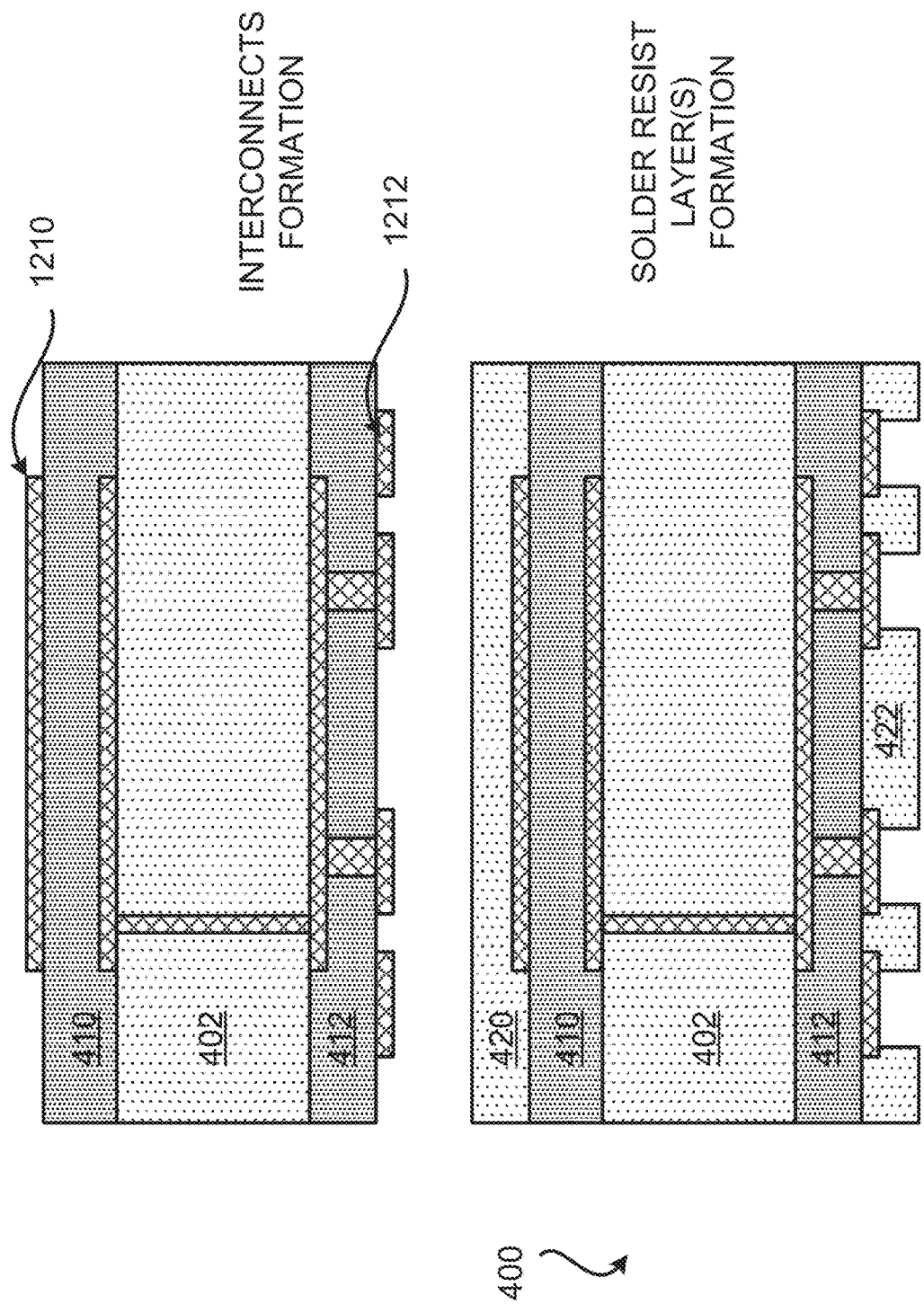

Stage 6, as shown in FIG. 12C, illustrates a state after a plurality of interconnects 1210 are formed over the second dielectric layer 410, and after a plurality of interconnects 1212 are formed in and over the third dielectric layer 412. A plating process may be used to form the plurality of interconnects 1210 and 1212. The plurality of interconnects 1210-1212 may include traces, vias and/or pads. The plurality of interconnects 1210-1212 may include one or more metal layers (e.g., seed layer+metal layer).

Stage 7 illustrates a state after a first solder resist layer 420 is formed over the second dielectric layer 410, and after a second solder resist layer 422 is formed over the third dielectric layer 412.

Figure 12D:
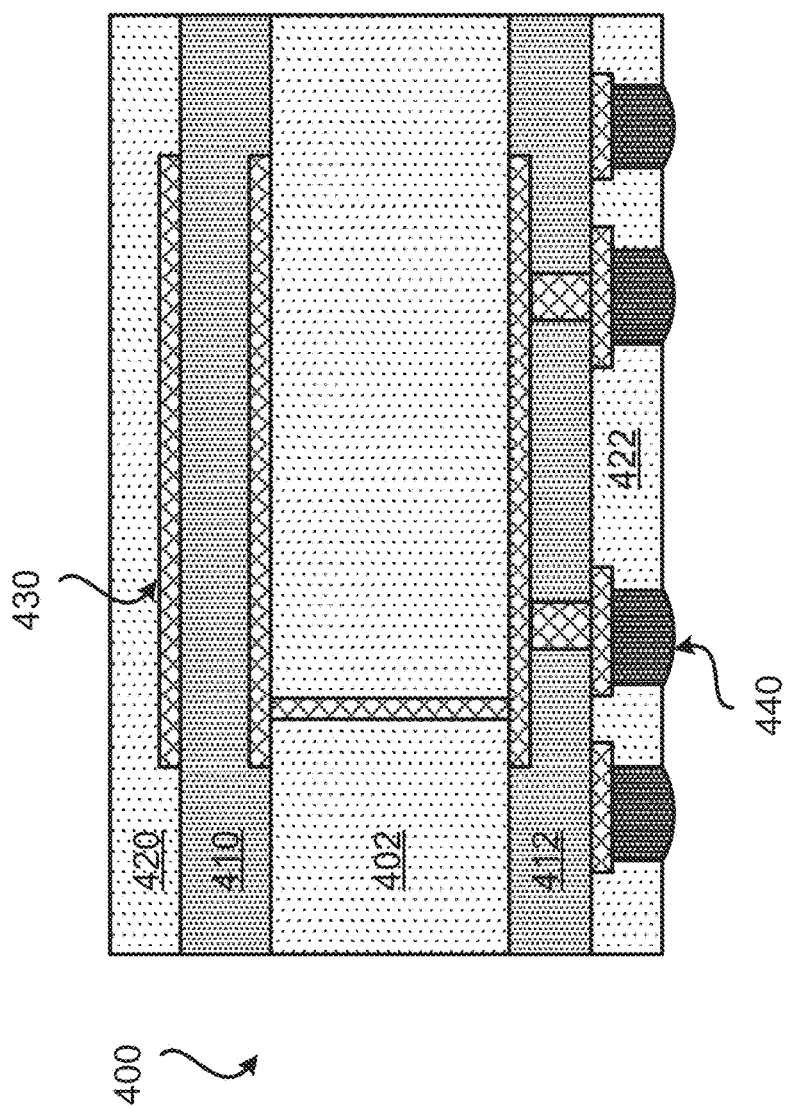

Stage 8, as shown in FIG. 12D, illustrates a state a plurality of solder interconnects 440 are provided in the cavities of the second solder resist layer 422. The plurality of interconnects 430 may represent the plurality of interconnects 1202, 1210 and 1212. Stages 7 and/or 8 may illustrate the antenna device 400 of FIG. 4.

FIGS. 12A-12D illustrate an example of a sequence for fabricating an antenna device. However, different implementations may use a different process and/or a sequence for forming the interconnects. In some implementations, a chemical vapor deposition (CVD) process and/or a physical vapor deposition (PVD) process may be used to form the interconnects. A sputtering process, a spray coating, and/or a plating process may be used to form the interconnects.

Exemplary Sequence for Fabricating a Discrete Antenna Device

Figure 13A:
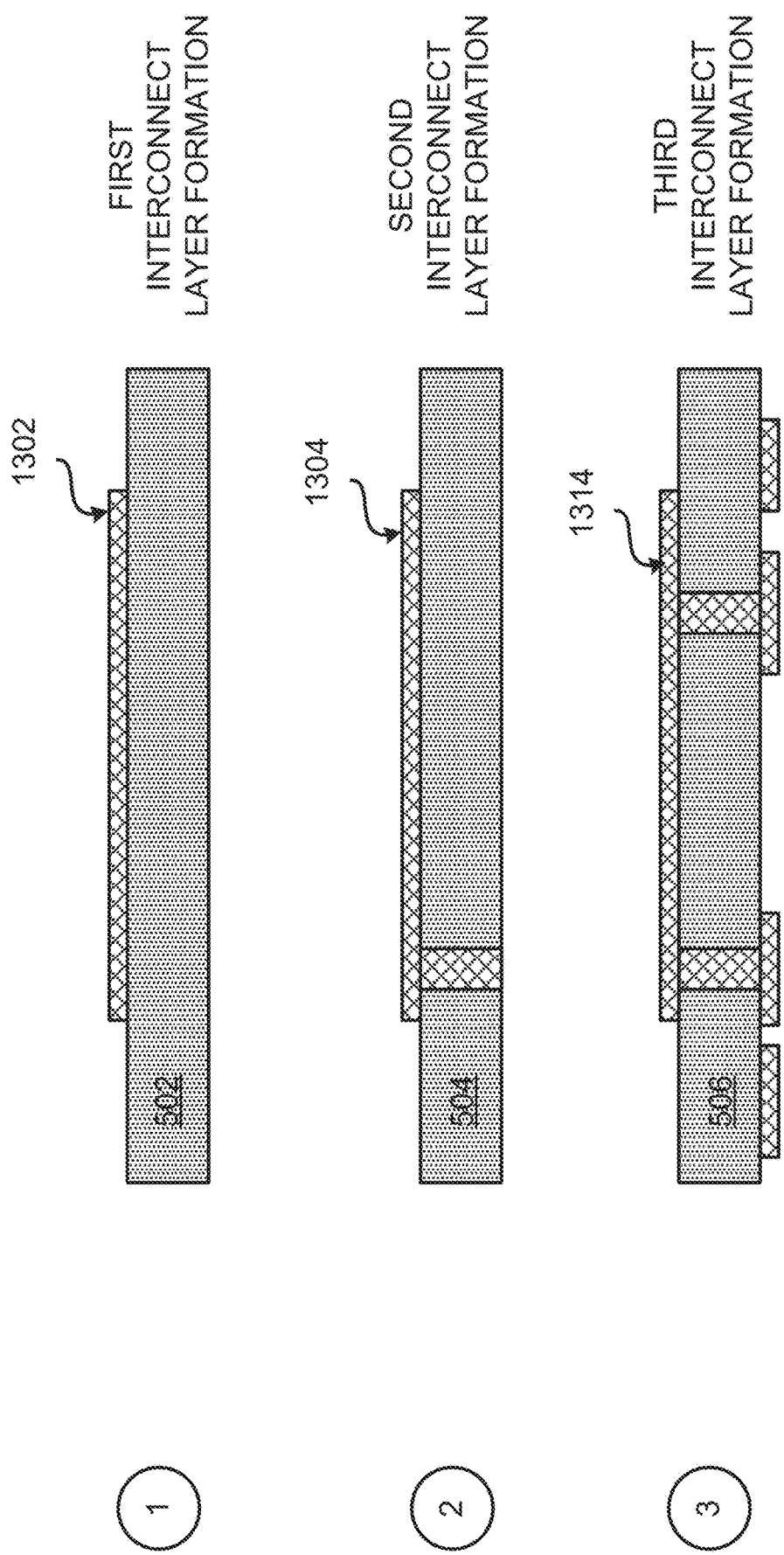
FIGS. 13A-13C illustrate an exemplary sequence for fabricating another discrete antenna device.
Figure 13B:
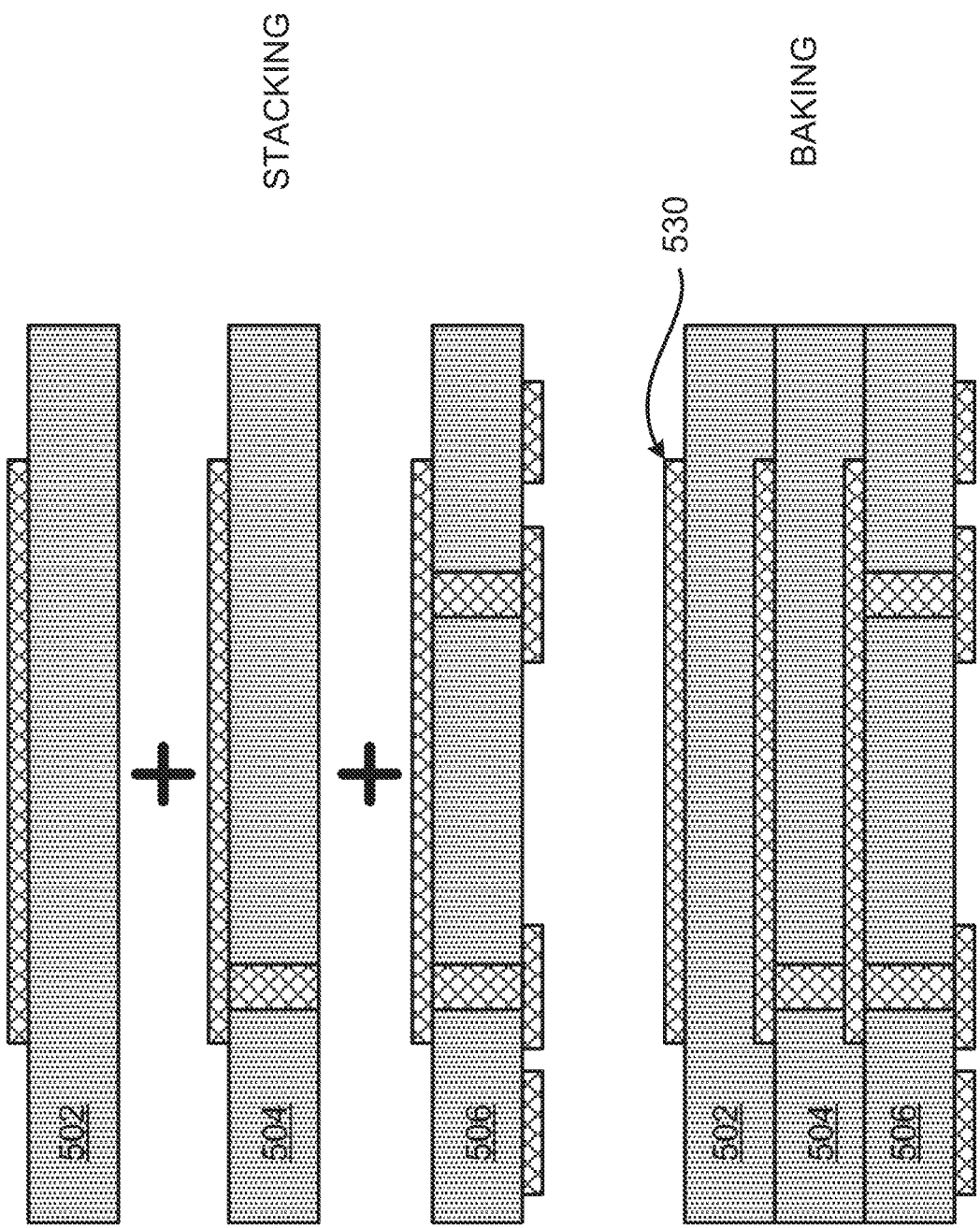
Figure 13C:
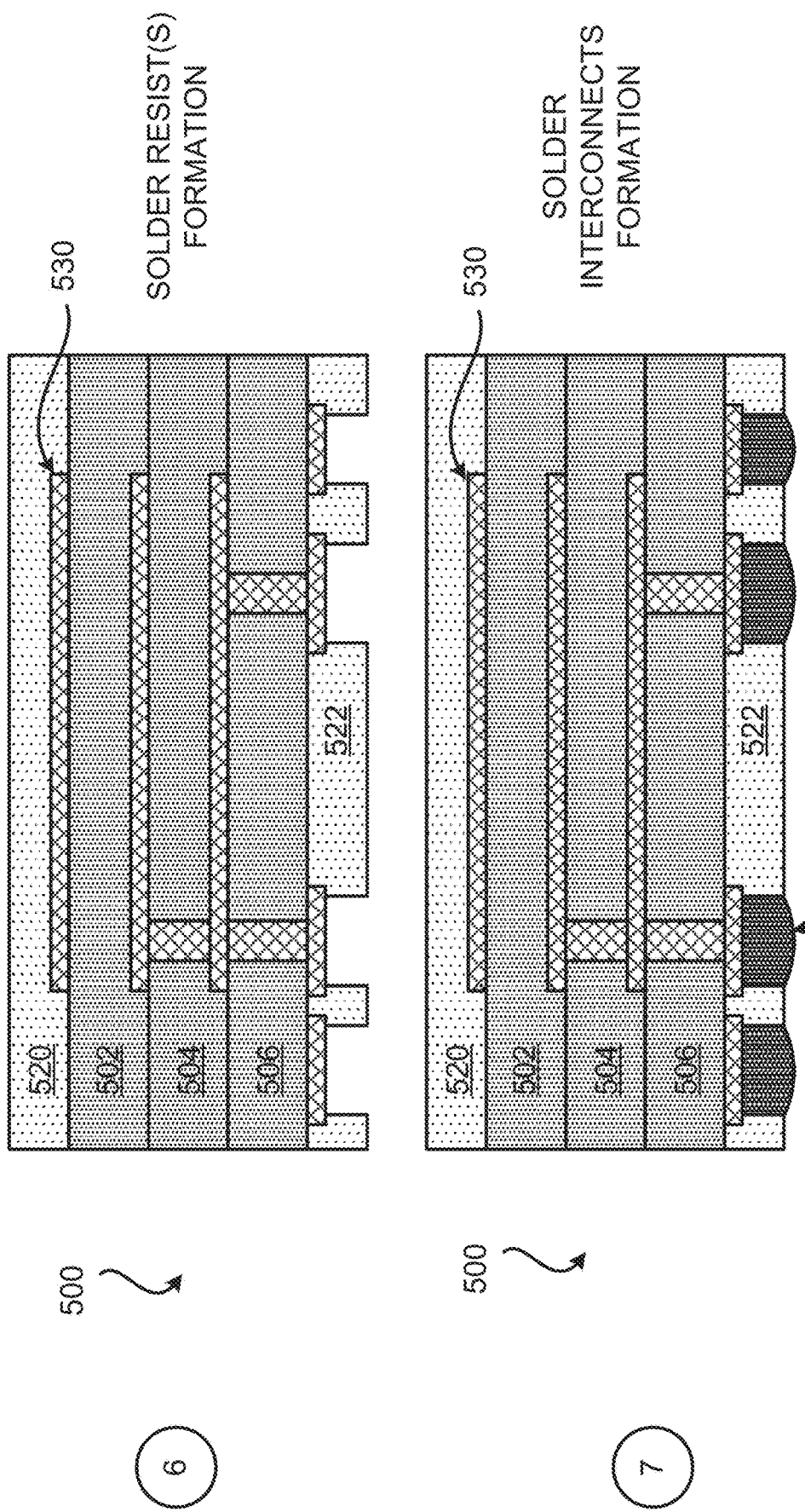

FIGS. 13A-13C illustrate an exemplary sequence for providing or fabricating a discrete antenna device. In some implementations, the sequence of FIGS. 13A-13C may be used to provide or fabricate the antenna device 500 of FIG. 5, or any of the antenna devices described in the disclosure.

It should be noted that the sequence of FIGS. 13A-13C may combine one or more stages in order to simplify and/or clarify the sequence for providing or fabricating the antenna device. In some implementations, the order of the processes may be changed or modified. In some implementations, one or more of processes may be replaced or substituted without departing from the spirit of the disclosure.

Stage 1, as shown in FIG. 13A, illustrates a state after a first dielectric layer 502 and a first plurality of interconnects 1302 are provided and formed. The first dielectric layer 502 may be a film (e.g., ceramic film) and the first plurality of interconnects 1302 may be disposed over the first dielectric layer 502.

Stage 2 illustrates a state after a second dielectric layer 504 and a second plurality of interconnects 1304 are provided and formed. The second dielectric layer 504 may be a film (e.g., ceramic film) and the second plurality of interconnects 1304 may be disposed in and over the second dielectric layer 504.

Stage 3 illustrates a state after a third dielectric layer 506 and a third plurality of interconnects 1306 are provided and formed. The third dielectric layer 506 may be a film (e.g., ceramic film) and the third plurality of interconnects 1306 may be disposed in and over the third dielectric layer 506.

Stage 4, as shown in FIG. 13B, illustrates a state after (i) the second dielectric layer 504 comprising the second plurality of interconnects 1304 is stacked over the third dielectric layer 506 comprising the third plurality of interconnects 1306, and (ii) the first dielectric layer 502 comprising the first plurality of interconnects 1302 is stacked over the second dielectric layer 504 comprising the second plurality of interconnects 1304.

Stage 5 illustrates a state after the stacked dielectric layers (e.g., 502, 504, 506) are baked to form dielectric layers that are coupled to one another. In some implementations, the first dielectric layer 502, the second dielectric layer 504 and the third dielectric layer 506 may be considered as one dielectric layer. That is, the baking process may combine the first dielectric layer 502, the second dielectric layer 504 and the third dielectric layer 506 into one dielectric layer. The first dielectric layer 502, the second dielectric layer 504 and the third dielectric layer 506 may include ceramic, such as a low temperature co-fired ceramic (LTCC) or a high temperature co-fired ceramic (HTCC).

Stage 6 illustrates a state after a first solder resist layer 520 is formed over the first dielectric layer 502, and after a second solder resist layer 522 is formed over the third dielectric layer 506.

Stage 7 illustrates a state a plurality of solder interconnects 540 are provided in the cavities of the second solder resist layer 522. The plurality of interconnects 430 may represent the plurality of interconnects 1302, 1304 and 1306. Stages 6 and/or 7 may illustrate the antenna device 500 of FIG. 5.

FIGS. 13A-13C illustrate an example of a sequence for fabricating an antenna device. However, different implementations may use a different process and/or a sequence for forming the interconnects. In some implementations, a chemical vapor deposition (CVD) process and/or a physical vapor deposition (PVD) process may be used to form the interconnects. A sputtering process, a spray coating, and/or a plating process may be used to form the interconnects.

Exemplary Flow Diagram of a Method for Fabricating a Discrete Antenna Device

Figure 14:
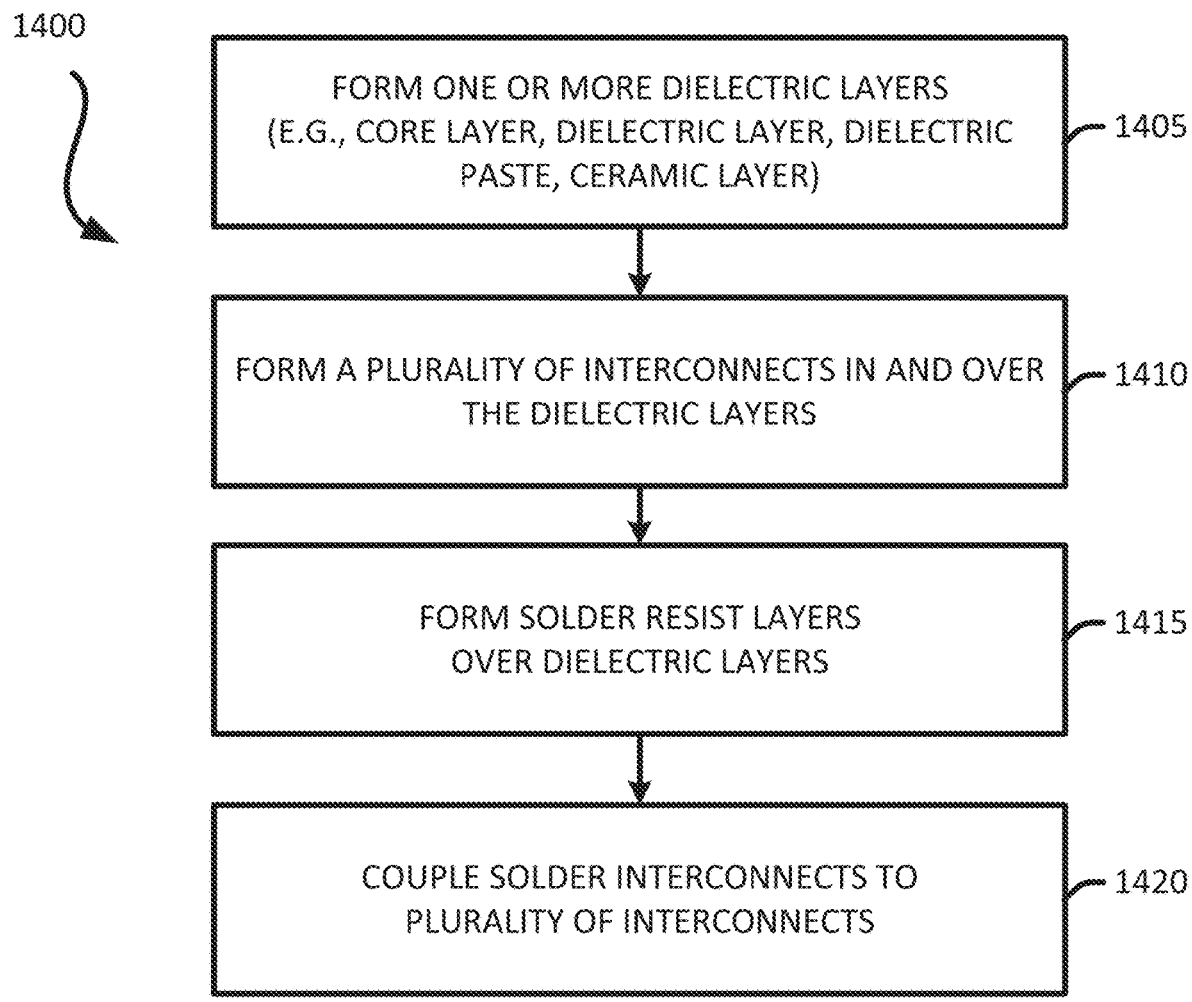
FIG. 14 illustrates an exemplary flow diagram of a method for fabricating a discrete antenna device.

In some implementations, fabricating a discrete antenna device includes several processes. FIG. 14 illustrates an exemplary flow diagram of a method 1400 for providing or fabricating a discrete antenna device. In some implementations, the method 1400 of FIG. 6 may be used to provide or fabricate the antenna device 400 of FIG. 4 described in the disclosure. However, the method 1400 may be used to provide or fabricate any of the dies described in the disclosure. For example, the method 1400 may also be used to fabricate the antenna device 500 of FIG. 5.

It should be noted that the sequence of FIG. 14 may combine one or more processes in order to simplify and/or clarify the method for providing or fabricating an antenna device. In some implementations, the order of the processes may be changed or modified.

The method forms (at 1405) one or more dielectric layers (e.g., 402, 410, 412). Depending on the type of antenna device that is being fabricated, the dielectric layers may include a core layer and/or a ceramic layer (e.g., LTCC, HTCC). Forming dielectric layers may include a lamination process and/or include providing one or more dielectric films (e.g., dielectric layers 502, 504, 506).

The method forms (at 1410) a plurality of interconnects (e.g., 1202, 1210, 1212, 1302, 1304, 1306) in and over the dielectric layers (e.g., 402, 410, 412, 502, 504, 506). A plating process may be used to form the interconnects. However, other processes may be used to form the interconnects. In some implementations, a chemical vapor deposition (CVD) process and/or a physical vapor deposition (PVD) process may be used to forms the interconnects. Moreover, a sputtering process, a pasting process, and/or a spray coating may be used to form the interconnects. In some implementations, the plurality of interconnects may be formed after each dielectric layer is formed.

The method forms (at 1415) solder resist layers (e.g., 420, 422) over the dielectric layers (e.g., 402, 410, 412).

The method couples (at 1420) a plurality of solder interconnects (e.g., 440) to the plurality of interconnects (e.g., 430).

In some implementations, several antenna devices are formed over a wafer and/or a carrier. In such instances, the wafer or carrier is cut (e.g., singulated, diced) into several discrete antenna devices. The wafer or carrier may be cut using a mechanical process (e.g., saw) and/or a laser process (e.g., laser ablation).

Figure 15A:
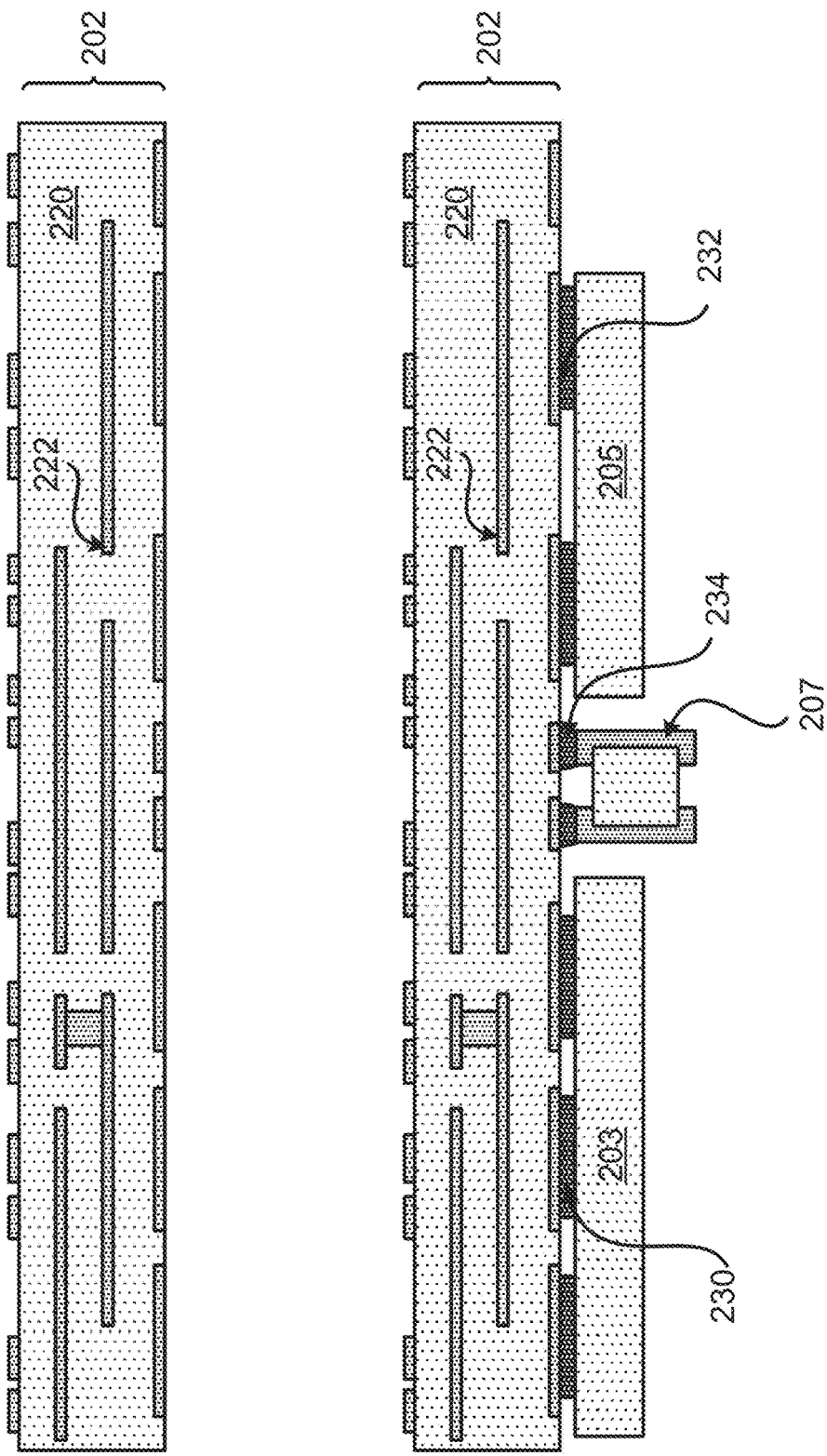
FIGS. 15A-15C illustrate an exemplary sequence for fabricating a package that includes several discrete antenna devices.
Figure 15B:
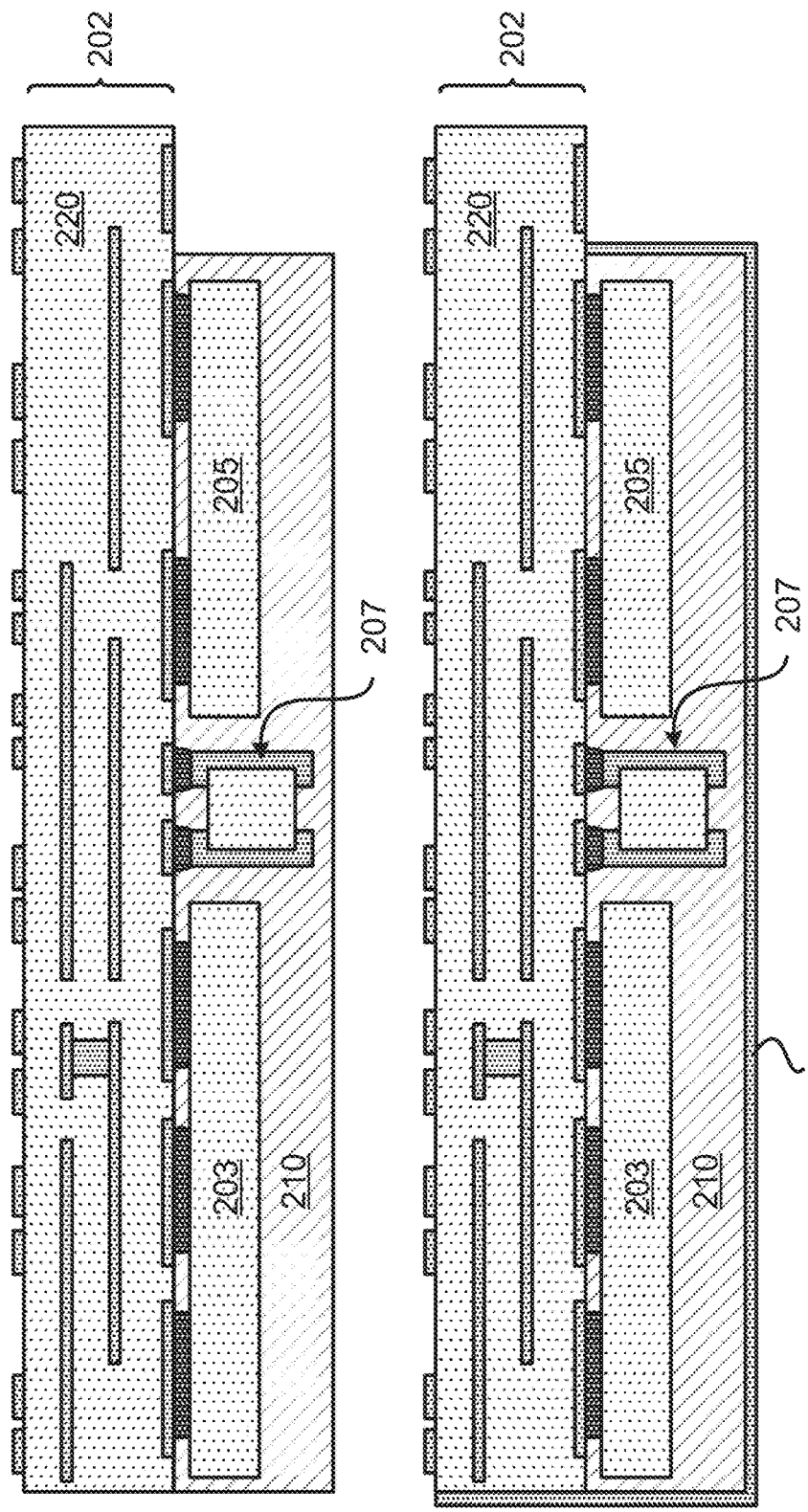
Figure 15C:
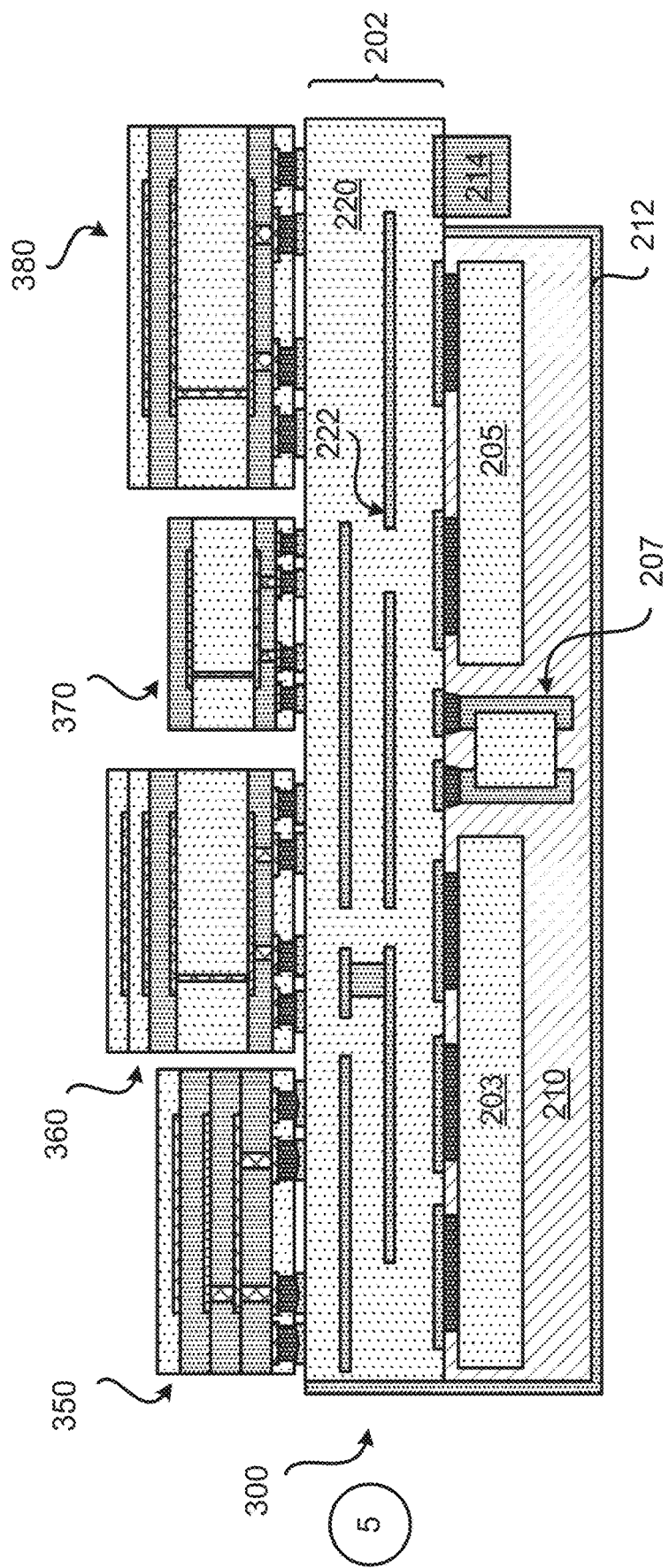

Exemplary Sequence for Fabricating a Package that Includes a Discrete Antenna Device FIGS. 15A-15C illustrate an exemplary sequence for providing or fabricating a package that includes a discrete antenna device. In some implementations, the sequence of FIGS. 15A-15C may be used to provide or fabricate the package 300 of FIG. 3, or any of the packages (e.g., 200, 300, 800, 900, 1000, 1100) described in the disclosure.

It should be noted that the sequence of FIGS. 15A-15C may combine one or more stages in order to simplify and/or clarify the sequence for providing or fabricating the package. In some implementations, the order of the processes may be changed or modified. In some implementations, one or more of processes may be replaced or substituted without departing from the spirit of the disclosure.

Stage 1, as shown in FIG. 15A, illustrates a state after a substrate 202 is provided. The substrate 202 includes at least one dielectric layer 220 and a plurality of interconnects 222 (e.g., traces, pads, vias). The substrate 202 that is provided may be fabricated. The fabrication of the substrate may include a lamination process and a plating process. Examples of processes for fabricating a substrate includes a semi additive process (SAP) and a modified semi additive process (mSAP). However, different implementations may fabricate a substrate differently. The substrate 202 is fabricated separately from an antenna device.

Stage 2 illustrates a state after a first integrated device 203, a second integrated device 205 and a passive device 207 are coupled to a second surface of the substrate 202. The first integrated device 203 is coupled to the substrate 202 through the plurality of solder interconnects 230. The second integrated device 205 is coupled to the substrate 202 through the plurality of solder interconnects 232. The passive device 207 is coupled to the substrate 202 through the plurality of solder interconnects 234. A solder reflow process may be used to couple the integrated devices and/or passive devices.

Stage 3, as shown in FIG. 15B, illustrates a state after an encapsulation layer 210 is provided over the second surface of the substrate 202. In particular, the encapsulation layer 210 is provided such that the encapsulation layer 210 encapsulates the first integrated device 203, the second integrated device 205 and the passive device 207. Different implementations may provide the encapsulation layer 210 over the substrate 202 by using various processes. For example, the encapsulation layer 210 may be provided over the substrate 202 by using a compression and transfer molding process, a sheet molding process, or a liquid molding process.

Stage 4 illustrates a state after a shield 212 is formed over the encapsulation layer 210 and over a side portion of the substrate 202. The shield 212 may include one or more metal layers (e.g., patterned metal layer(s)). The shield 212 may be configured to operate as an electromagnetic interference (EMI) shield. A plating process, a chemical vapor deposition (CVD) process, a physical vapor deposition (PVD) process, a sputtering process, and/or a spray coating may be used to form the shield 212.

Stage 5, as shown in FIG. 15C, illustrates a state after the discrete antenna devices (e.g., 350, 360, 370, 380) are coupled to a first surface of the substrate 202. A reflow process may be used to couple solder interconnects between the discrete antenna devices (e.g., 350, 360, 370, 380) and interconnects of the substrate 202. Stage 5 also illustrates a connector 214 coupled to a second surface of the substrate 202. Stage 5 may illustrate the package 300 of FIG. 3.

Figure 16:
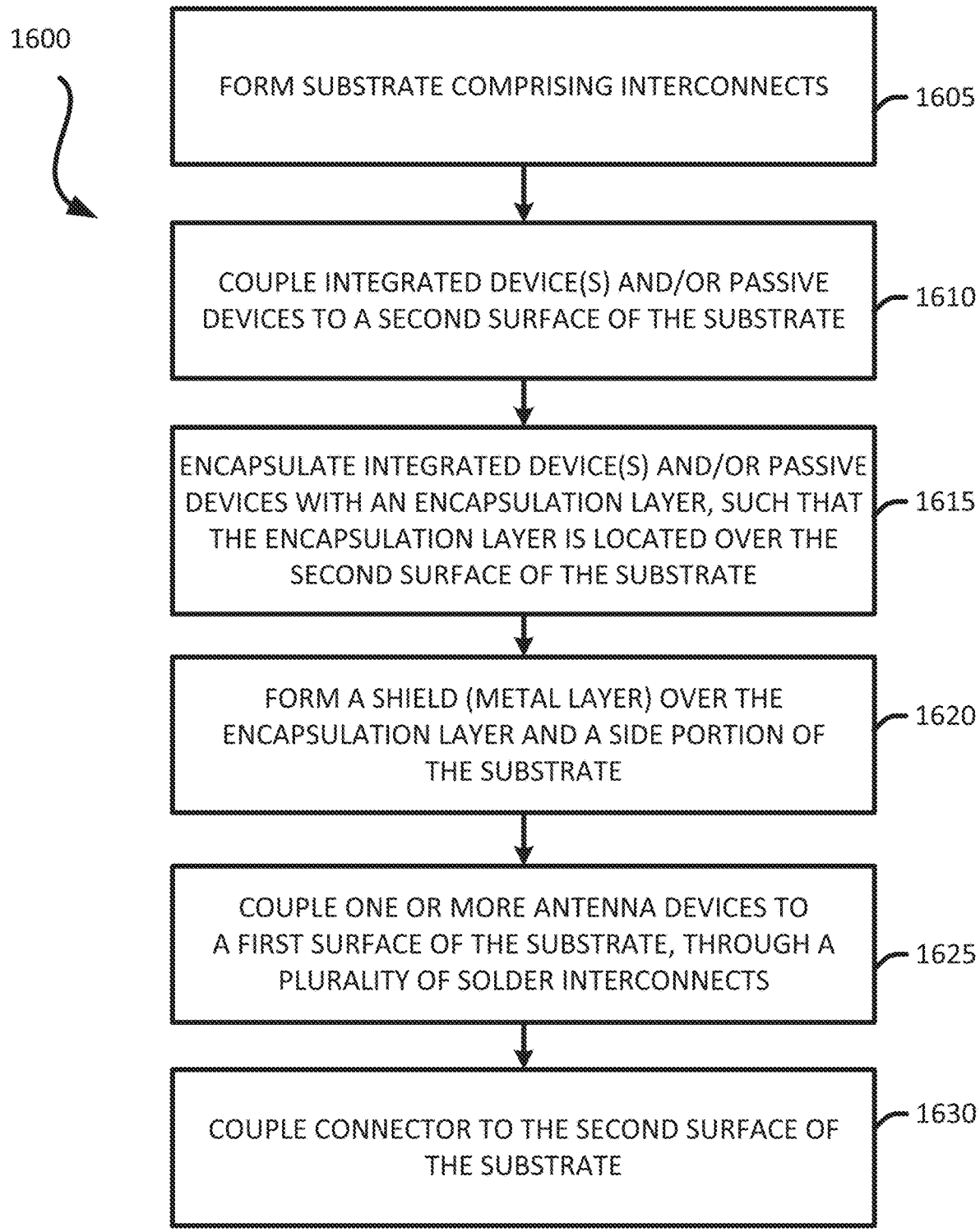
FIG. 16 illustrates an exemplary flow diagram of a method for fabricating a package that includes several discrete antenna devices.

Exemplary Flow Diagram of a Method for Fabricating a Package that Includes a Discrete Antenna Device In some implementations, fabricating a package having a discrete antenna device includes several processes. FIG. 16 illustrates an exemplary flow diagram of a method 1600 for providing or fabricating a package having a discrete antenna device. In some implementations, the method 1600 of FIG. 16 may be used to provide or fabricate the package 300 of FIG. 3 described in the disclosure. However, the method 1600 may be used to provide or fabricate any of the packages (e.g., 200, 300, 800, 900, 1000, 1100) described in the disclosure.

It should be noted that the sequence of FIG. 16 may combine one or more processes in order to simplify and/or clarify the method for providing or fabricating a package having a discrete antenna device. In some implementations, the order of the processes may be changed or modified.

The method provides (at 1605) a substrate (e.g., 202) that includes dielectric layers (e.g., 220) and interconnects (e.g., 222). The fabrication of the substrate may include a lamination process and a plating process. Examples of processes for fabricating a substrate includes a semi additive process (SAP) and a modified semi additive process (mSAP). However, different implementations may fabricate a substrate differently.

The method couples (at 1610) integrated device(s) and/or passive device(s) to a second surface of the substrate (e.g., 202). For example, the method may couple (i) the first integrated device 203 to the substrate 202 through the plurality of solder interconnects 230, (iii) the second integrated device 205 to the substrate 202 through the plurality of solder interconnects 232, and (iii) the passive device 207 to the substrate 202 through the plurality of solder interconnects 234. A reflow process may be used to couple the integrated devices and passive devices to the substrate.

The method encapsulates (at 1615) the integrated device(s) and the passive device(s) with an encapsulation layer (e.g., 210). For example, the encapsulation layer 210 may be provided such that the encapsulation layer 210 encapsulates the first integrated device 203, the second integrated device 205 and the passive device 207, such that the encapsulation layer 210 is located over the second surface of the substrate 202. In some implementations, the encapsulation layer 210 may be formed over the second surface (e.g., bottom surface) of the substrate 202 such that (i) a first vertical surface of the encapsulation layer 210 is coplanar with a first vertical surface (e.g., 820) of the substrate 202, (ii) a second vertical surface of the encapsulation layer 210 is coplanar with a second vertical surface (e.g., 830) of the substrate 202, and/or (iii) a third vertical surface of the encapsulation layer 210 is coplanar with a third vertical surface (e.g., 840) of the substrate 202. Different implementations may provide the encapsulation layer 210 over the substrate 202 by using various processes. For example, the encapsulation layer 210 may be provided over the substrate 202 by using a compression and transfer molding process, a sheet molding process, or a liquid molding process.

The method forms (at 1620) a shield 212 over the encapsulation layer 210 and over a side portion of the substrate 202. The shield 212 may include one or more metal layers (e.g., patterned metal layer(s)). The shield 212 may be configured to operate as an electromagnetic interference (EMI) shield. A plating process, a chemical vapor deposition (CVD) process, a physical vapor deposition (PVD) process, a sputtering process, and/or a spray coating may be used to form the shield 212.

The method couples (at 1625) one or more antenna devices (e.g., 350, 360, 370, 380, 400, 500) to a first surface of the substrate (e.g. 202). For example, a first antenna device may be coupled to a first surface of the substrate through a plurality of solder interconnects. A reflow process may be used to couple solder interconnects between the discrete antenna devices (e.g., 350, 360, 370, 380) and interconnects of the substrate 202.

The method couples (at 1630) at least one connector (e.g., 614) to the substrate (e.g., 202). It is noted that instead of a connector or in addition to a connector, some implementations may include other types of connections, such as a wire and/or flexible interconnect.

Exemplary Flow Diagram of a Method for Assembling and Testing a Package that Includes a Discrete Antenna Device As mentioned above, one advantage of using discrete antenna devices with a package is the ability to easily mix and match different types of discrete antenna devices without having to substantially redesign the entire package.

Figure 17:
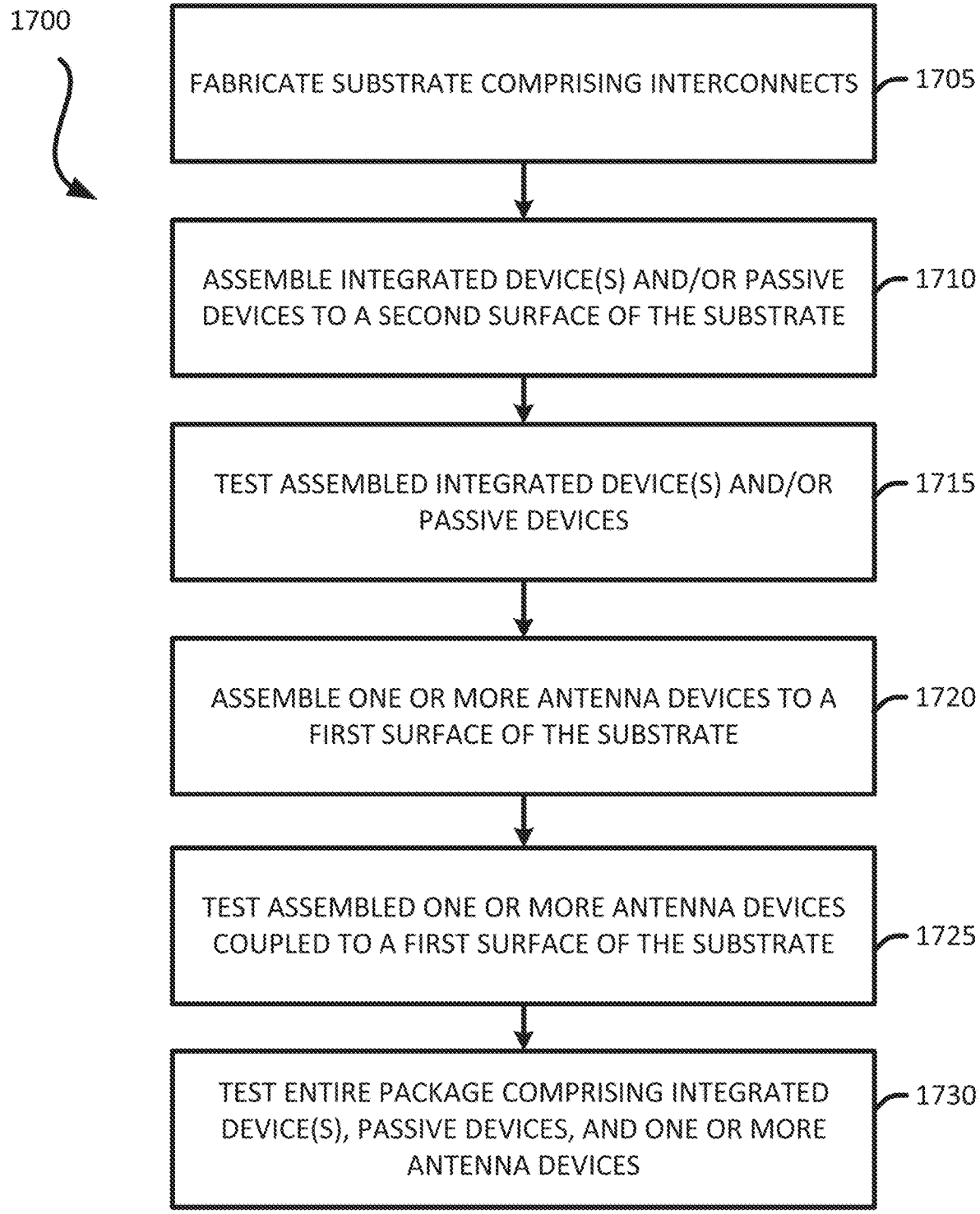
FIG. 17 illustrates an exemplary flow diagram of a method for assembling a package that includes several discrete antenna devices.

FIG. 17 illustrates an exemplary flow diagram of a method 1700 for assembling and testing a package that includes a discrete antenna device. The method 1700 of FIG. 17 will be used to describe assembling and testing the package 300 of FIG. 3. However, the method 1700 may be used to assemble and test any of the packages (e.g., 200, 800, 900, 1000, 1100) described in the disclosure.

It should be noted that the sequence of FIG. 16 may combine one or more processes in order to simplify and/or clarify the method for assembling and testing a package having a discrete antenna device. In some implementations, the order of the processes may be changed or modified.

The method fabricates (at 1705) a substrate (e.g., 202) that includes dielectric layers (e.g., 220) and interconnects (e.g., 222). The fabrication of the substrate may include a lamination process and a plating process. Examples of processes for fabricating a substrate includes a semi additive process (SAP) and a modified semi additive process (mSAP). However, different implementations may fabricate a substrate differently. In some implementations, the substrate has already been fabricated by another party.

The method assembles (at 1710) integrated device(s) and/or passive device(s) to the substrate (e.g., 202). For example, the method may couple (i) the first integrated device 203 to the substrate 202 through the plurality of solder interconnects 230, (iii) the second integrated device 205 to the substrate 202 through the plurality of solder interconnects 232, and (iii) the passive device 207 to the substrate 202 through the plurality of solder interconnects 234. A reflow process may be used to couple the integrated devices and passive devices to the substrate. Assembling the integrated devices and/or passive devices may also include encapsulating the integrated device(s) and the passive device(s) with an encapsulation layer (e.g., 210) and forming a shield 212 over the encapsulation layer 210 and over a side portion of the substrate 202. The shield 212 may include one or more metal layers (e.g., patterned metal layer(s)). The shield 212 may be configured to operate as an electromagnetic interference (EMI) shield. A plating process, a chemical vapor deposition (CVD) process, a physical vapor deposition (PVD) process, a sputtering process, and/or a spray coating may be used to form the shield 212.

The method tests (at 1715) the assembled integrated devices and/or passive devices. The method may perform one or more tests on the assembled integrated devices and/or passive devices. If the assembled integrated devices and/or passive devices does not pass the test, the entire assembly may be discarded or recycled. In some implementations, if the assembled integrated devices and/or passive devices does not pass the test, any defective component may be removed and replaced with another component and the test is performed again. If the assembled integrated devices and/or passive devices passes the test(s), the method proceeds to 1720.

The method assembles (at 1720) one or more antenna devices (e.g., 350, 360, 370, 380, 400, 500) to the substrate (e.g. 202). A reflow process may be used to couple solder interconnects between the discrete antenna devices (e.g., 350, 360, 370, 380) and interconnects of the substrate 202.

The method tests (at 1725) the assembled antenna devices. The method may perform one or more tests on the assembled antenna devices. If one or more of the assembled antenna devices do not pass the test, the entire assembly may be discarded or recycled. In some implementations, if one or more of the assembled antenna devices do not pass the test, any defective antenna device may be removed and replaced with another antenna device and the test is performed again. If the assembled antenna devices pass the test(s), the method proceeds to 1730.

The method tests (at 1730) the entire package that includes the antenna devices, integrated devices and/or passive devices. The method may perform one or more tests on the entire package. If the entire package does not pass the test, the entire package may be discarded or recycled. In some implementations, if the entire package does not pass the test, any defective component may be removed and replaced with another component and the test is performed again.

Exemplary Electronic Devices

Figure 18:
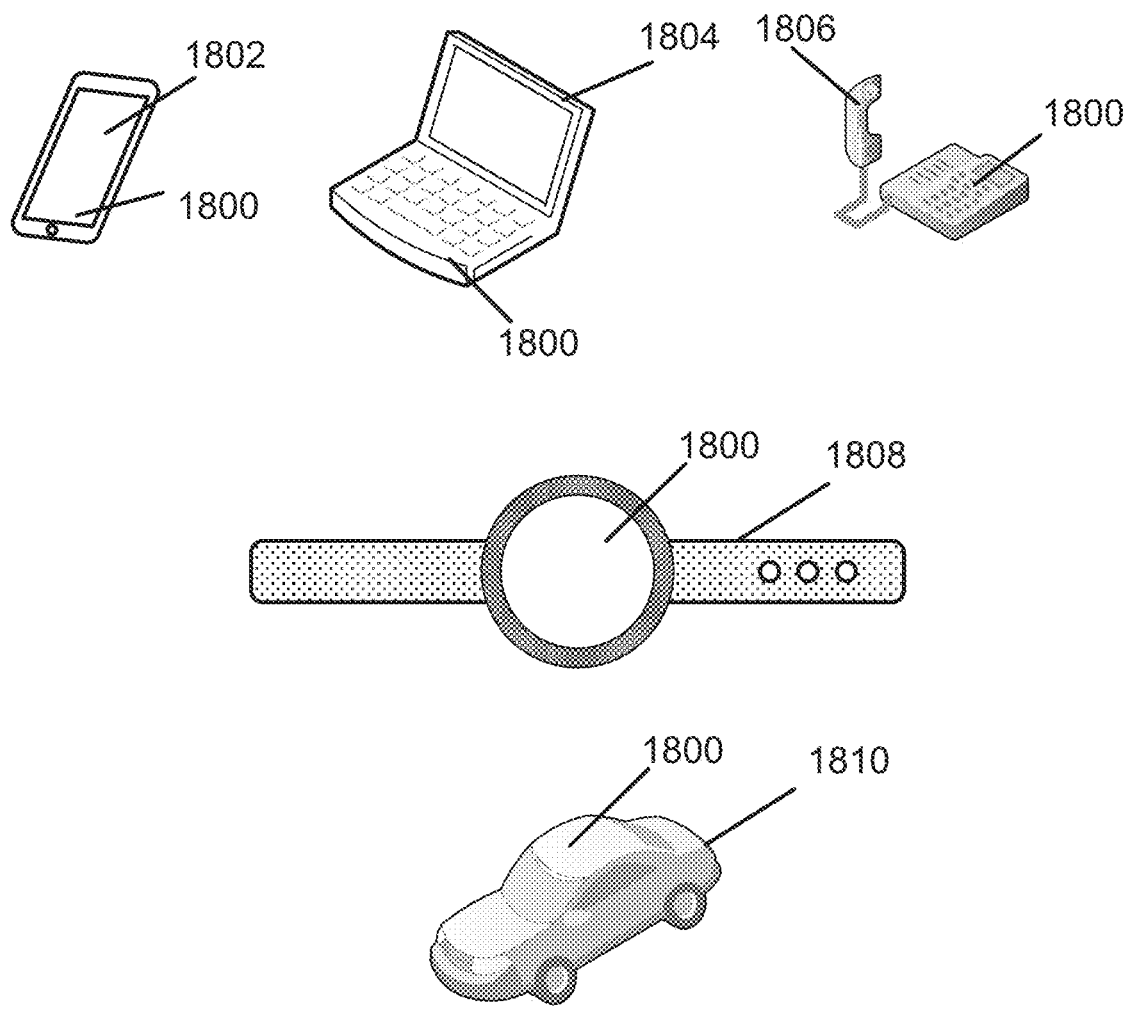
FIG. 18 illustrates various electronic devices that may integrate a die, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-11, 12A-12D, 13A-13C, 14, 15A-15C, and/or 16-18 may be rearranged and/or combined into a single component, process, feature or function or embodied in several components, processes, or functions. Additional elements, components, processes, and/or functions may also be added without departing from the disclosure. It should also be noted FIGS. 2-11, 12A-12D, 13A-13C, 14, 15A-15C, and/or 16-18 and its corresponding description in the present disclosure is not limited to dies and/or ICs. In some implementations, FIGS. 2-11, 12A-12D, 13A-13C, 14, 15A-15C, and/or 16-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
a substrate comprising a first surface and a second surface, wherein the substrate comprises a plurality of interconnects;
first means for transmitting and receiving a first signal, coupled to the first surface of the substrate, through a first plurality of solder interconnects, wherein a portion of the first means for transmitting and receiving the first signal, overhangs over the substrate such that a portion of the first means for transmitting and receiving the first signal does not vertically overlap with any portion of the substrate;
second means for transmitting and receiving a second signal, coupled to the first surface of the substrate, through a second plurality of solder interconnects;
an integrated device coupled to the second surface of the substrate;
means for encapsulation coupled to the second surface of the substrate,
wherein a vertical surface of the means for encapsulation is coplanar with a vertical surface of the substrate, and
wherein the means for encapsulation encapsulates the integrated device; and
means for shielding coupled to a surface of the means for encapsulation, wherein the means for shielding is configured to provide electromagnetic interference (EMI) shielding.

2. The apparatus of claim 1, wherein the means for encapsulation is coupled to the second surface of the substrate such that a second vertical surface of the means for encapsulation is coplanar with a second vertical surface of the substrate.

3. The apparatus of claim 1,
wherein the first means for transmitting and receiving the first signal, is configured to transmit and/or receive the first signal having a first frequency, and
wherein the second means for transmitting and receiving the second signal, is configured to transmit and/or receive the second signal having a second frequency.

4. The apparatus of claim 1,
wherein the first means for transmitting and receiving the first signal comprises:
a first plurality of pads configured to provide at least one electrical path for ground; and
a second plurality of pads configured to provide at least one electrical path for signals,
wherein the first plurality of pads laterally surround the second plurality of pads, and
wherein the first means for transmitting and receiving the first signal is coupled to the first surface of the substrate, through the first plurality of solder interconnects such that (i) a first group of solder interconnects from the first plurality of solder interconnects are coupled to the first plurality of pads and (ii) a second group of solder interconnects from the first plurality of solder interconnects are coupled to the second plurality of pads.

5. The apparatus of claim 1, wherein the second means for transmitting and receiving the second signal is configured to operate as a dipole antenna.

6. The apparatus of claim 1, wherein the second means for transmitting and receiving the second signal comprises:
at least one dielectric layer; and
at least one antenna device interconnect configured as an antenna.

7. The apparatus of claim 1, wherein a portion of the second means for transmitting and receiving the second signal overhangs over the substrate such that the portion of the second means for transmitting and receiving the second signal does not vertically overlap with any portion of the substrate.

8. The apparatus of claim 1,
wherein the second means for transmitting and receiving the first signal comprises:
a first plurality of pads configured to provide at least one electrical path for ground; and
a second plurality of pads configured to provide at least one electrical path for signals,
wherein the first plurality of pads laterally surround the second plurality of pads, and
wherein the second means for transmitting and receiving the second signal is coupled to the first surface of the substrate, through the second plurality of solder interconnects such that (i) a first group of solder interconnects from the second plurality of solder interconnects are coupled to the first plurality of pads and (ii) a second group of solder interconnects from the second plurality of solder interconnects are coupled to the second plurality of pads.

9. The apparatus of claim 1, further comprising a connector coupled to the second surface of the substrate.

10. The apparatus of claim 1, wherein the integrated device is coupled to the second surface of the substrate through at least a third plurality of solder interconnects.

11. The apparatus of claim 1, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

12. The apparatus of claim 1, wherein the means for shielding is formed over a surface of the means for encapsulation.

13. The apparatus of claim 12,
wherein the means for shielding is further formed over a side surface of the substrate, and
wherein a side portion of the first means for transmitting and receiving the first signal, is free of the means for shielding.

14. The apparatus of claim 1, wherein the first means for transmitting and receiving the first signal, is coupled to the first surface of the substrate such that (i) a first portion of the first means for transmitting and receiving the first signal, overhangs over a first side the substrate, and (ii) a second portion of the first means for transmitting and receiving the first signal, overhangs over a second side the substrate.

15. The apparatus of claim 14, wherein the first means for transmitting and receiving the first signal is configured to operate as a dipole antenna.

16. The apparatus of claim 1, wherein the first means for transmitting and receiving the first signal comprises:
at least one dielectric layer; and
at least one antenna device interconnect configured as an antenna.

17. The apparatus of claim 16, wherein the at least one dielectric layer comprises a low temperature co-fired ceramic (LTCC) or a high temperature co-fired ceramic (HTCC).

* * * * *